US008846531B2

(12) United States Patent
Tamaso et al.

(10) Patent No.: US 8,846,531 B2
(45) Date of Patent: Sep. 30, 2014

(54) METHOD OF MANUFACTURING AN OHMIC ELECTRODE CONTAINING TITANIUM, ALUMINUM AND SILICON ON A SILICON CARBIDE SURFACE

(75) Inventors: Hideto Tamaso, Osaka (JP); Keiji Wada, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/387,097

(22) PCT Filed: Jul. 30, 2010

(86) PCT No.: PCT/JP2010/062904
§ 371 (c)(1),
(2), (4) Date: Jan. 25, 2012

(87) PCT Pub. No.: WO2011/043120
PCT Pub. Date: Apr. 14, 2011

(65) Prior Publication Data
US 2012/0129343 A1 May 24, 2012

(30) Foreign Application Priority Data

Oct. 5, 2009 (JP) ................................. 2009-231513

(51) Int. Cl.
*H01L 21/44* (2006.01)
*H01L 29/66* (2006.01)
(Continued)

(52) U.S. Cl.
CPC ...... *H01L 21/0485* (2013.01); *H01L 29/66068* (2013.01); *H01L 29/45* (2013.01); *H01L 29/1608* (2013.01); *H01L 29/7802* (2013.01)
USPC .................................... 438/685; 257/E21.158

(58) Field of Classification Search
USPC .......................................... 438/685, 597, 584
See application file for complete search history.

(56) References Cited

U.S. PATENT DOCUMENTS 5,877,077 A 3/1999 Kronlund
5,883,003 A * 3/1999 Matsubara .................... 438/655
(Continued)

FOREIGN PATENT DOCUMENTS

CN 1088256 C 7/2002
JP 62-262422 A 11/1987
(Continued)

OTHER PUBLICATIONS

Tanimoto et al., "Practical Device-Directed Ohmic Contacts on 4H-SiC," IEICE Transactions C, The Institute of Electronics, Information and Communication Engineers, vol. J86-C, No. 4, pp. 359-367 (Apr. 2003).
(Continued)

*Primary Examiner* — Charles Garber
*Assistant Examiner* — Brigette Paterson
(74) *Attorney, Agent, or Firm* — Venable LLP; Michael A. Sartori; Tamatane J. Aga

(57) ABSTRACT

To provide a method of manufacturing a semiconductor device that can be in contact with both of an n-type SiC region and a p-type SiC region and can suppress increase in contact resistance due to oxidation, a method of manufacturing a semiconductor device includes the steps of preparing a SiC layer, and forming an ohmic electrode on a main surface of the SiC layer. The step of forming the ohmic electrode includes the steps of forming a conductor layer which will become the ohmic electrode on the main surface of the SiC layer, and performing heat treatment such that the conductor layer becomes the ohmic electrode. After the step of performing the heat treatment, a temperature of the ohmic electrode when a surface of the ohmic electrode is exposed to an atmosphere containing oxygen is set to 100° C. or lower.

10 Claims, 17 Drawing Sheets

(51) Int. Cl.
*H01L 29/45* (2006.01)
*H01L 21/04* (2006.01)
*H01L 29/78* (2006.01)
*H01L 29/16* (2006.01)

(56) References Cited

U.S. PATENT DOCUMENTS

| | | | |
|---|---|---|---|
| 6,043,513 A | 3/2000 | Kronlund | |
| 2003/0107041 A1* | 6/2003 | Tanimoto et al. | 257/77 |
| 2007/0262399 A1* | 11/2007 | Dewey et al. | 257/410 |
| 2010/0055858 A1* | 3/2010 | Hayashi et al. | 438/285 |
| 2010/0102332 A1 | 4/2010 | Takahashi et al. | |
| 2010/0207125 A1* | 8/2010 | Uchida et al. | 257/77 |

FOREIGN PATENT DOCUMENTS

| | | |
|---|---|---|
| JP | 01-268121 A | 10/1989 |
| JP | 05-343401 A | 12/1993 |
| JP | 09-106959 A | 4/1997 |
| JP | 10-512716 | 12/1998 |
| JP | 11-008419 A | 1/1999 |
| JP | 11-054459 A | 2/1999 |
| JP | 2002-075909 A | 3/2002 |
| JP | 2002-203810 A | 7/2002 |
| JP | 2004-288890 A | 10/2004 |
| JP | 2009-164228 A | 7/2009 |
| WO | WO-2008/114838 A1 | 9/2008 |
| WO | WO 2009/013886 * 1/2009 | ............ H01L 21/336 |
| WO | WO 2009/054140 * 4/2009 | .......... H01L 31/0312 |

OTHER PUBLICATIONS

Kakanakov et al., "Improved Al/Si ohmic contacts to p-type 4H-SiC," Materials Science and Engineering, B80, pp. 374-377 (2001).
Notification with Information Offer Form in Japanese Patent Application No. 2009-231513 dated Apr. 17, 2012.
Notification of the First Office Action issued in Chinese Patent Application No. 201080040219.4 dated Feb. 8, 2014.
L. Kolaklieva et al., "Au/Ti/Al Contacts to SiC for Power Applications: Electrical, Chemical and Thermal Properties," 2004 24th International Conference on Microelectronics (IEEE CAT. No. 04TH8716) IEEE Piscataway, NJ, USA, vol. 2, No. 24, May 16, 2004, pp. 421-424.
Guo et al., "Ti-Al based ohmic contacts to n-type 6H-SiC with P+ion implantation," Chinese Physics, Institute of Physics Publishing, Bristol, GB, vol. 15, No. 9, Sep. 1, 2006, pp. 2142-2145.
Uemoto, "Reduction of Ohmic Contact Resistance on n-Type 6H-SiC by Heavy Doping," Japanese Journal of Applied Physics, Japan Society of Applied Physics, JP, vol. 34, No. 1A, Part 2, Jan. 1, 1995, pp. L07-L09.
Extended European Search Report in European Patent Application No. 10821791.0, dated May 21, 2014.

* cited by examiner

METHOD OF MANUFACTURING AN OHMIC ELECTRODE CONTAINING TITANIUM, ALUMINUM AND SILICON ON A SILICON CARBIDE SURFACE

TECHNICAL FIELD

The present invention relates to a method of manufacturing a semiconductor device, and more particularly to a method of manufacturing a semiconductor device that suppresses increase in contact resistance of an electrode.

BACKGROUND ART

In a semiconductor device, in many cases, a structure in which an n-type region having n conductivity type and a p-type region having p conductivity type are formed and an electrode is connected to the n-type region and the p-type region is adopted. With higher efficiency being achieved in recent years in an apparatus where a semiconductor device is included, a semiconductor device is also required to achieve higher efficiency. In order to achieve higher efficiency of a semiconductor device, the electrode above should be low not only in its own resistance (electrical resistance) but also in contact resistance with the n-type region and the p-type region above.

Meanwhile, in order to achieve a higher withstand voltage and lower loss of a semiconductor device and to enable use thereof in an environment at a high temperature, silicon carbide (SiC) has recently been adopted as a material for forming a semiconductor device. SiC is a wide-bandgap semiconductor greater in bandgap than silicon (Si) that has been conventionally widely used as a material for forming a semiconductor device. Therefore, by adopting SiC as a material for forming a semiconductor device, a higher withstand voltage, a lower ON resistance and the like of a semiconductor device can be achieved. In addition, a semiconductor device adopting SiC as a material is also advantageous in that lowering in characteristics when used in an environment at a high temperature is less likely than in a semiconductor device adopting Si as a material.

In adopting SiC as a material for a semiconductor device, however, it is difficult to avoid increase in Schottky barrier between an n-type region, a p-type region and an electrode as compared with an example where Si is adopted as a material for a semiconductor device. Consequently, a problem of difficulty in suppression of increase in contact resistance between an n-type region, a p-type region and an electrode has arisen.

In contrast, it has been known that contact resistance can be lowered by adopting Ni (nickel) as a material for an electrode in contact with an n-type SiC region containing an n-type impurity (an impurity having n conductivity type) and adopting Ti (titanium)/Al (aluminum) or AlSi alloy as a material for an electrode in contact with a p-type SiC region containing a p-type impurity (an impurity having p conductivity type) (see, for example, Non-Patent Literature 1).

CITATION LIST

Non Patent Literature

NPL 1: Satoshi TANIMOTO et al., "Practical Device-Directed Ohmic Contacts on 4H-SiC," IEICE Transactions C, the Institute of Electronics, Information and Communication Engineers, April 2003, Vol. J86-C, No. 4, pp. 359-367

SUMMARY OF INVENTION

Technical Problem

As described above, by appropriately selecting a material for forming an electrode in accordance with whether a region in contact with an electrode is an n-type SiC region or a p-type SiC region, contact resistance between an n-type region, a p-type region and an electrode can be lowered even when SiC is adopted as a material for a semiconductor device. If a material for forming an electrode in contact with an n-type region is different from a material for forming an electrode in contact with a p-type region, however, a plurality of steps for forming these electrodes are required, which leads to increase in the number of steps in a manufacturing process. Consequently, a problem of increase in manufacturing cost of a semiconductor device arises. In addition, difference between a material for forming an electrode in contact with an n-type region and a material for forming an electrode in contact with a p-type region may prevent improvement in integration of a semiconductor device.

Then, as means for solving the problems described above, it has recently been studied to use an ohmic contact electrode containing Ti, Al, and Si as materials for forming an electrode. An ohmic contact electrode containing Ti, Al, and Si can be in contact with any of an n-type SiC region and a p-type SiC region, with contact resistance being sufficiently suppressed.

However, in the ohmic contact electrode containing titanium, aluminum, and silicon described above, titanium and aluminum components contained in the electrode are very easily oxidizable. Thus, if the electrode is left at a location with a high temperature, it is immediately oxidized. Specifically, an oxide film is formed between the electrode and an n-type SiC region/a p-type SiC region. Since the oxide film is electrically insulating, it serves as an electrical resistance between the electrode and the n-type SiC region/the p-type SiC region. Namely, if the electrode is oxidized, the electrode immediately causes increase in contact resistance with the n-type SiC region and the p-type SiC region.

The present invention was made in view of the above problems, and one object of the present invention is to provide a method of manufacturing a semiconductor device that can be in contact with both of an n-type SiC region and a p-type SiC region and can suppress increase in contact resistance due to oxidation.

Solution to Problem

A method of manufacturing a semiconductor device in accordance with the present invention is a method of manufacturing a semiconductor device including the steps of preparing a SiC layer composed of silicon carbide, and forming an ohmic electrode on a main surface of the SiC layer. The step of forming the ohmic electrode includes the steps of forming a conductor layer which will become the ohmic electrode on the main surface of the SiC layer, and performing heat treatment such that the conductor layer becomes the ohmic electrode. In the step of forming the ohmic electrode, an ohmic contact electrode containing titanium, aluminum, and silicon is formed. After the step of performing the heat treatment, a temperature of the ohmic electrode when a surface of the ohmic electrode is exposed to an atmosphere containing oxygen is set to 100° C. or lower. It is to be noted that the main surface herein refers to a major surface having a largest area of the surfaces.

As the ohmic electrode formed on the main surface of the SiC layer composed of silicon carbide, for example, an ohmic contact electrode as an alloy containing titanium, aluminum, and silicon is conceivable. As a result of earnest study, the inventors of the present invention have found that, when the alloyed ohmic contact electrode described above is heated to a temperature exceeding 100° C. in an atmosphere containing oxygen, the alloy in the vicinity of a main surface of the ohmic contact electrode is oxidized. Therefore, after the above ohmic contact electrode alloyed through heat treatment is formed, the ohmic electrode is exposed to an atmosphere containing oxygen. On this occasion, if the vicinity of the main surface of the ohmic contact electrode is maintained at 100° C. or lower, oxidation of the vicinity of the main surface of the ohmic contact electrode and resultant formation of a high-resistance layer having a high electrical resistance in the vicinity of the main surface can be suppressed. Thus, increase in contact resistance in the main surface of the ohmic contact electrode can be suppressed. It is to be noted that, in a case where the alloyed ohmic contact electrode is formed and thereafter the ohmic contact electrode is exposed to an atmosphere not containing oxygen, oxidation of the vicinity of the main surface of the ohmic contact electrode can be suppressed even if the atmosphere has a temperature exceeding 100° C.

Preferably, the method of manufacturing a semiconductor device in accordance with the present invention described above further includes the step of forming an electrode pad on one main surface of the ohmic electrode after the step of forming the ohmic electrode. If the main surface of the ohmic electrode is covered with a front surface electrode pad made of a metal material in this manner, oxidation of the vicinity of the main surface of the ohmic electrode and resultant formation of a high-resistance layer having a high electrical resistance in the vicinity of the main surface can be suppressed, even if the ohmic electrode is placed in an atmosphere containing oxygen exceeding 100° C. Thus, increase in contact resistance in the main surface of the ohmic contact electrode can be suppressed. Further, semiconductor devices such as a plurality of MOSFETs formed on one substrate can be electrically connected to each other, using the front surface electrode pad.

Preferably, the method of manufacturing a semiconductor device in accordance with the present invention described above includes the step of removing a high-resistance layer formed in the one main surface of the ohmic electrode after the step of forming the ohmic electrode and before the step of forming the electrode pad.

As described above, if the ohmic electrode is formed by alloying through heat treatment and thereafter the ohmic electrode is maintained at 100° C. or lower in the atmosphere containing oxygen, oxidation of the vicinity of the main surface of the ohmic electrode and resultant formation of a high-resistance layer can be suppressed. However, from then until the step of forming the electrode pad, the manufacturing method includes, for example, the step of forming a back surface electrode pad, the step of cleaning a substrate, and the like. If the main surface of the ohmic electrode is exposed to an atmosphere containing oxygen exceeding 100° C. when these steps are performed, there is a possibility that the vicinity of the main surface of the ohmic electrode is oxidized and a high-resistance layer is formed. Therefore, it is preferable to perform the step of removing a high-resistance layer formed on the one main surface of the ohmic electrode before performing the step of forming the electrode pad. If the electrode pad is formed after a high-resistance layer is removed in this manner, this allows the ohmic electrode not to include a high-resistance layer. Thus, increase in contact resistance in the main surface of the ohmic contact electrode can be suppressed. It is to be noted that, in order to maximize the effect of removing a high-resistance layer, it is more preferable to perform the step of removing a high-resistance layer immediately before the step of forming the electrode pad.

The method of manufacturing a semiconductor device in accordance with the present invention described above may include the step of maintaining the one main surface of the ohmic electrode at 100° C. or lower in the atmosphere containing oxygen after the step of forming the ohmic electrode and before the step of forming the electrode pad.

As described above, after formation of the ohmic electrode until the step of forming the electrode pad, the manufacturing method includes, for example, the step of forming a back surface electrode pad, the step of cleaning a substrate, and the like. If the main surface of the ohmic electrode is exposed to an atmosphere containing oxygen exceeding 100° C. when these steps are performed, there is a possibility that the vicinity of the main surface of the ohmic electrode is oxidized and a high-resistance layer is formed. Therefore, the main surface of the ohmic electrode is prevented from being exposed to an atmosphere containing oxygen exceeding 100° C. after the step of forming the ohmic electrode (alloying) until the step of forming the electrode pad is performed. Namely, if the atmosphere in which the ohmic electrode is placed is an atmosphere containing oxygen, the temperature of the atmosphere is maintained at 100° C. or lower. Thus, even in a case where oxidation of the main surface of the ohmic electrode is suppressed, the main surface of the ohmic electrode can be kept not to be oxidized until immediately before the step of forming the electrode pad on the main surface of the ohmic electrode is performed. Therefore, increase in contact resistance in the main surface of the ohmic contact electrode can be suppressed. It is to be noted that, in order to more reliably suppress oxidation of the main surface of the ohmic electrode, it is more preferable to maintain the temperature at 60° C. or lower after the step of forming the ohmic electrode (alloying) until the step of forming the electrode pad is performed.

The method of manufacturing a semiconductor device in accordance with the present invention described above may include the step of forming a protective film on the one main surface of the ohmic electrode after the step of forming the ohmic electrode and before the step of forming the electrode pad.

As described above, after formation of the ohmic electrode until the step of forming the electrode pad is performed, there is a possibility that the vicinity of the main surface of the ohmic electrode may be oxidized. In order to suppress this, it is preferable to perform the step of forming a protective film on the one main surface of the ohmic electrode after the step of forming the ohmic electrode and before the step of forming the electrode pad. Thus, oxidation of the vicinity of the main surface of the ohmic electrode can be suppressed by the action of the protective film. It is to be noted that the step of forming a protective film is preferably performed immediately after the ohmic electrode alloyed through heat treatment is formed. Further, the protective film is not a component of the semiconductor device in accordance with the present invention. Accordingly, the protective film is preferably removed immediately before the step of forming the electrode pad is performed.

Advantageous Effects of Invention

According to the manufacturing method in accordance with the present invention, a semiconductor device that can be in contact with both of an n-type SiC region and a p-type SiC region and can suppress increase in contact resistance due to oxidation can be provided.

DESCRIPTION OF EMBODIMENTS

Figure 1:
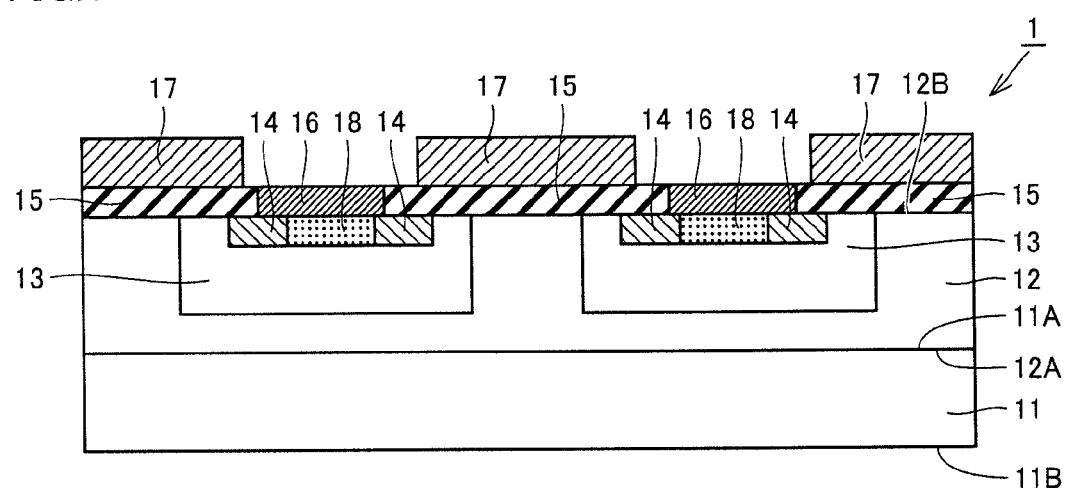
FIG. 1 is a schematic cross-sectional view showing main components of a MOSFET as a semiconductor device in accordance with the present invention.

Embodiments of the present invention will be described hereinafter with reference to the drawings. In the drawings below, the same or corresponding elements have the same reference characters allotted and description thereof will not be repeated.

(First Embodiment)

Initially, a MOSFET in a first embodiment will be described. Referring to FIG. 1, a MOSFET 1 in the first embodiment includes an $n^+$ SiC substrate 11 as a substrate composed of silicon carbide (SiC) and having n conductivity type (a first conductivity type), an $n^-$ SiC layer 12 as a semiconductor layer composed of SiC and having n conductivity type (the first conductivity type), a pair of p bodies 13 as second-conductivity-type regions having p conductivity type (a second conductivity type), an $n^+$ source region 14 as a high-concentration first-conductivity-type region having n conductivity type (the first conductivity type), and a $p^+$ region 18 as a high-concentration second-conductivity-type region having p conductivity type (the second conductivity type). $N^+$ SiC substrate 11 contains an n-type impurity (an impurity having n conductivity type) such as N (nitrogen) at high concentration. A plurality of MOSFETs 1 are aligned on the $n^+$ SiC substrate in a periodically repeated manner, forming one device as a whole.

$N^-$ SiC layer 12 is formed on one main surface 11A of $n^+$ SiC substrate 11, for example, to a thickness of approximately 10 μm, and it has n conductivity type by containing an n-type impurity. Examples of the n-type impurity contained in $n^-$ SiC layer 12 include N (nitrogen) and P (phosphorus), and the impurity is contained at concentration lower than concentration of the n-type impurity contained in $n^+$ SiC substrate 11, for example, at concentration of $1\times10^{16}$ $cm^{-3}$. It is to be noted that the main surface herein refers to a major surface having a largest area of the surfaces.

A pair of p bodies 13 is formed such that the p bodies are separate from each other so as to include a second main surface 12B of $n^-$ SiC layer 12, which is a main surface opposite to a first main surface 12A which is a main surface on the $n^+$ SiC substrate 11 side, and the pair has p conductivity type (the second conductivity type) by containing a p-type impurity (an impurity having p conductivity type). For example, Al, B (boron), or the like is adopted as a p-type impurity to be contained in p body 13, and it is contained at concentration lower than concentration of the n-type impurity contained in $n^+$ SiC substrate 11, for example, at concentration of $1\times10^{17}$ $cm^{-3}$.

A pair of n⁺ source regions 14 is formed within each of a pair of p bodies 13 so as to include the second main surface 12B and to be surrounded by p body 13. N⁺ source region 14 contains an n-type impurity such as P (phosphorus) at concentration higher than concentration of the n-type impurity contained in n⁻ SiC layer 12, for example, at concentration of $1 \times 10^{20}$ cm⁻³.

P⁺ region 18 is formed to include the second main surface 12B in a region sandwiched by a pair of n⁺ source regions 14 within each of a pair of p bodies 13. P⁺ region 18 contains a p-type impurity such as Al or B at concentration higher than concentration of the p-type impurity contained in p body 13, for example, at concentration of $1 \times 10^{20}$ cm⁻³. It is to be noted that, with regard to a direction in which the second main surface 12B in FIG. 1 extends, a pair of n⁺ source regions 14 and p⁺ region 18 within p body 13 are arranged in contact with each other.

Referring further to FIG. 1, MOSFET 1 includes a gate oxide film 15 as a gate insulating film, a gate electrode 17, and a pair of source contact electrodes 16.

Gate oxide film 15 is formed on the second main surface 12B of n⁻ SiC layer 12 so as to be in contact with the second main surface 12B and to extend from one of n⁺ source regions 14 formed within one p body 13 to an upper surface of one of n⁺ source regions 14 formed within the other p body 13 arranged at a position adjacent to the above p body 13 with regard to the direction in which the second main surface 12B extends. Gate oxide film 15 is composed of, for example, silicon dioxide (SiO₂).

Gate electrode 17 is arranged in contact with gate oxide film 15 so as to extend from one of n⁺ source regions 14 formed within one p body 13 to the upper surface of one of n⁺ source regions 14 formed within the other p body 13 arranged at the position adjacent to the above p body 13 with regard to the direction in which the second main surface 12B extends. In addition, gate electrode 17 is made of a conductor such as polysilicon, Al, or the like.

Source contact electrode 16 extends from one of a pair of n⁺ source regions 14 arranged within each of a pair of p bodies 13, to p⁺ region 18 arranged in contact therewith and the other n⁺ source region 14, in a manner in contact with these regions. Source contact electrode 16 is also arranged on the second main surface 12B so as to be in contact with the second main surface 12B, as with gate oxide film 15. In other words, source contact electrode 16 is arranged on the second main surface 12B, in a region where gate oxide film 15 is not formed. In addition, source contact electrode 16 contains Ti, Al, and Si. More specifically, source contact electrode 16 contains Ti, Al, Si, and C (carbon) as well as a remaining impurity such as O (oxygen).

It is to be noted that FIG. 1 illustrates only components that are important for the operation principle of MOSFET 1. Thus, although not shown in FIG. 1, MOSFET 1 generally includes a front surface electrode pad, a back surface electrode pad, an interlayer insulating film, and a passivation film arranged therein. The front surface electrode pad is formed in contact with source contact electrode 16, and made of a conductor such as Ti, Al, or the like. The front surface electrode pad is electrically connected to n⁺ source region 14 with source contact electrode 16 sandwiched therebetween. Further, in the case of MOSFET 1 in FIG. 1, the front surface electrode pad is arranged to connect one source contact electrode 16 to the other source contact electrode 16 arranged at a position adjacent thereto.

In the case of MOSFET 1 having a configuration in FIG. 1, the back surface electrode pad has a function as a drain electrode. The back surface electrode pad is in contact with the other main surface 11B of n⁺ SiC substrate 11, which is a main surface opposite to one main surface 11A which is a main surface on a side where n⁻ SiC layer 12 is formed, and formed as a drain electrode. For example, this drain electrode may be made of a material containing Ti, Al, and Si, as with source contact electrode 16 above, or it may be made of another material capable of establishing ohmic contact with n⁺ SiC substrate 11, such as Ni. Thus, the drain electrode is electrically connected to n⁺ SiC substrate 11.

The interlayer insulating film has a function, for example, to electrically isolate gate electrode 17 and the front surface electrode pad arranged to connect one source contact electrode 16 to the other source contact electrode 16 in FIG. 1 from outside, as well as to protect MOSFET 1. This interlayer insulating film is composed of, for example, SiO₂.

The passivation film is formed as a protective film finally protecting MOSFET 1 from outside after the components of MOSFET 1 are all formed. The passivation film is also composed of, for example, SiO₂, as with the interlayer insulating film.

Namely, MOSFET 1 in the present embodiment includes n⁺ SiC substrate 11, n⁻ SiC layer 12 as a SiC layer formed on n⁺ SiC substrate 11 and composed of silicon carbide, source contact electrode 16 arranged in contact with n⁻ SiC layer 12, and the front surface electrode pad for facilitating input of an electrical signal to source contact electrode 16. Thus, source contact electrode 16 is an ohmic contact electrode arranged by establishing ohmic contact with n⁻ SiC layer 12. Source contact electrode 16 serves as an ohmic contact electrode containing Ti, Al, and Si in order to establish ohmic contact with both of n⁺ source region 14 and p⁺ region 18. That is, source contact electrode 16 is arranged to extend from a region in contact with n⁺ source region 14 to a region in contact with p⁺ region 18.

In MOSFET 1 in the present embodiment, source contact electrode 16 arranged in contact with n⁻ SiC layer 12 contains Ti, Al, and Si. This source contact electrode 16 can be in contact with p⁺ region 18 at contact resistance comparable to that of an electrode composed of Ti/Al and in contact with n⁺ source region 14 at contact resistance comparable to that of an electrode composed of Ni. This source contact electrode 16 is arranged to extend from the region in contact with n⁺ source region 14 to the region in contact with p⁺ region 18. Consequently, MOSFET 1 in the present embodiment is a semiconductor device capable of achieving decrease in the number of steps in a manufacturing process and improvement in integration.

More specifically, in MOSFET 1 in the present embodiment having a DMOS structure, it is necessary to hold n⁺ source region 14 and p body 13 at the same potential. Therefore, source contact electrode 16 is required to be electrically connected to both of n⁺ source region 14 and p body 13 with contact resistance being lowered. In addition, in MOSFET 1, in order to lower ON resistance, n⁺ source region 14 and source contact electrode 16 should be electrically connected to each other with contact resistance being suppressed. In this connection, source contact electrode 16 in MOSFET 1 in the present embodiment is in contact with both of n⁺ source region 14 and p body 13 (p⁺ region 18) at low contact resistance, by containing Ti, Al, and Si. Consequently, MOSFET 1 is a semiconductor device capable of achieving decrease in the number of steps in a manufacturing process and improvement in integration.

An operation of MOSFET 1 will now be described. Referring to FIG. 1, in such a state that a voltage not higher than a threshold value is applied to gate electrode 17 located at the center of FIG. 1, that is, in an OFF state, a portion between p body 13 and n⁻ SiC layer 12 located directly under gate oxide film 15 located at the center of FIG. 1 is reverse-biased and in a non-conducting state. On the other hand, as a positive voltage is applied to gate electrode 17 located at the center of FIG. 1, an inversion layer is formed in a channel region, which is a region around a portion of p body 13 located on the left side of FIG. 1 that is in contact with gate oxide film 15 at the center. Consequently, $n^+$ source region 14 and n⁻ SiC layer 12 are electrically connected to each other, and a current flows between source contact electrode 16 (or the front surface electrode pad connected to source contact electrode 16) and the drain electrode.

In order to cause a current to flow between source contact electrode 16 (or the front surface electrode pad connected to source contact electrode 16) and the drain electrode, source contact electrode 16 is required to be electrically connected to both of $n^+$ source region 14 and p body 13 with contact resistance between source contact electrode 16 and both of $n^+$ source region 14 and p body 13 being lowered. In addition, in MOSFET 1, in order to lower ON resistance, $n^+$ source region 14 and source contact electrode 16 should be electrically connected to each other with contact resistance being suppressed. In order to satisfy such requirements, MOSFET 1 in the present embodiment is formed by a manufacturing method described below.

Figure 2:
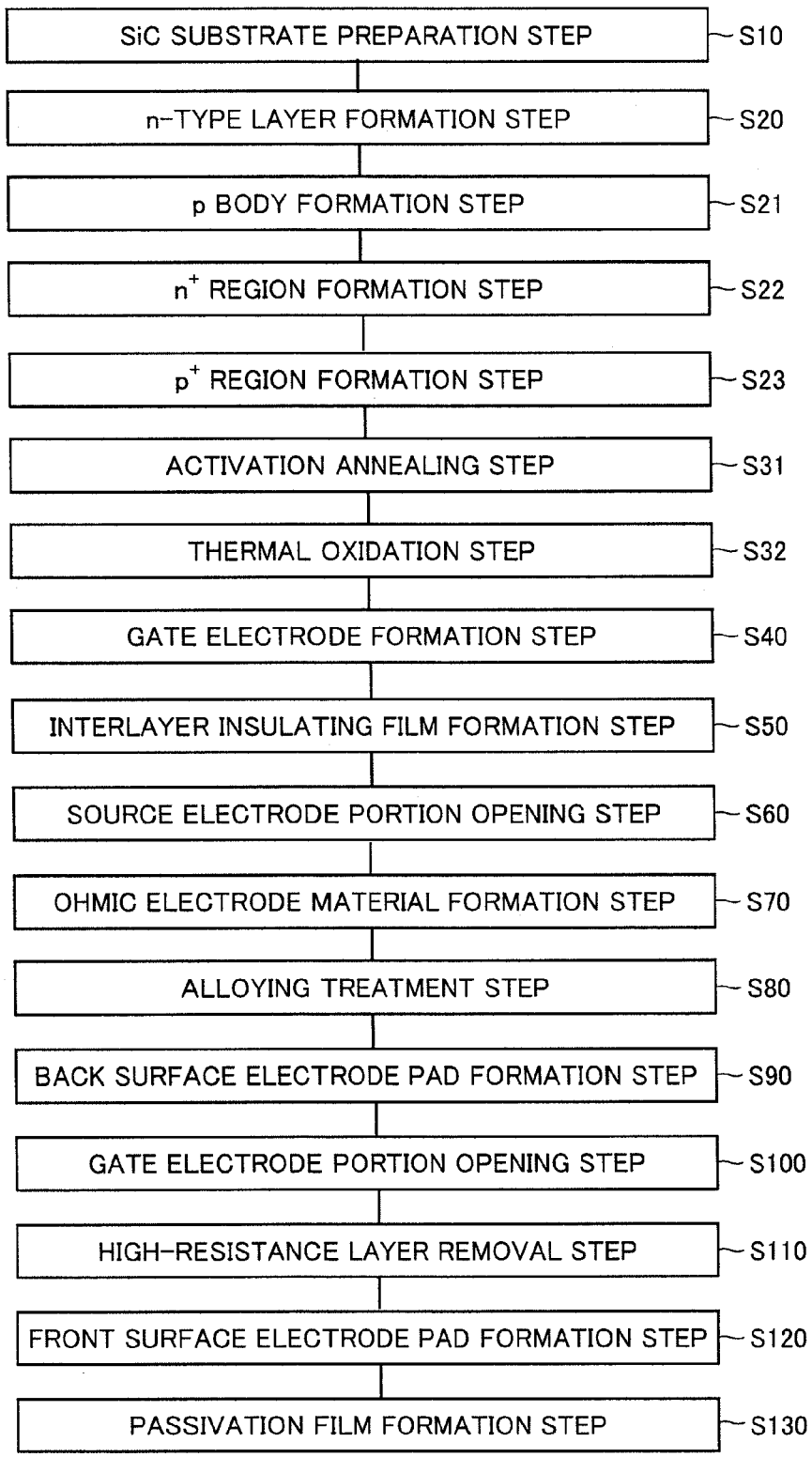
FIG. 2 is a flowchart showing an outline of a method of manufacturing a MOSFET in the first embodiment.
Figure 4:
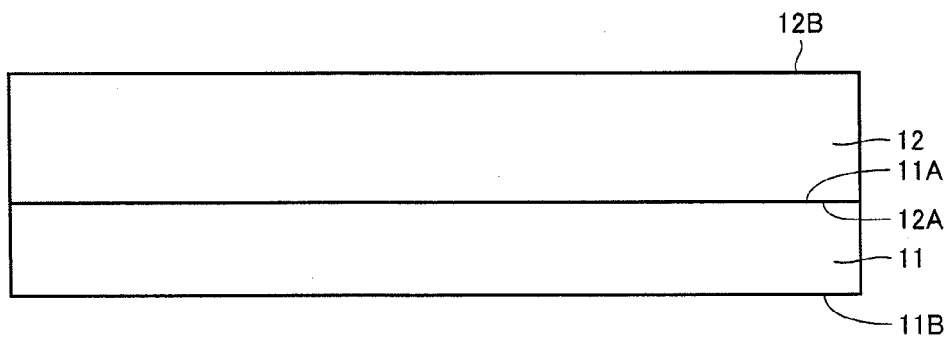
FIG. 4 is a schematic cross-sectional view for illustrating the method of manufacturing the MOSFET in the first embodiment.

A method of manufacturing a MOSFET representing a semiconductor device in the first embodiment as one embodiment of a method of manufacturing a semiconductor device according to the present invention will now be described. Referring to FIG. 2, in the method of manufacturing a MOSFET in the first embodiment, initially, a SiC substrate preparation step (S10) is performed. In this step (S10), a SiC substrate of the first conductivity type is prepared. Specifically, referring to FIG. 4, for example, $n^+$ SiC substrate 11 composed of hexagonal SiC and having n conductivity type by containing an n-type impurity is prepared.

Next, referring to FIG. 2, an n-type layer formation step (S20) is performed. In this step (S20), a semiconductor layer of the first conductivity type is formed on $n^+$ SiC substrate 11. Specifically, referring to FIG. 4, n⁻ SiC layer 12 composed of silicon carbide is formed on one main surface 11A of $n^+$ SiC substrate 11 through epitaxial growth. Epitaxial growth can be performed, for example, employing a gas mixture of $SiH_4$ (silane) and $C_3H_8$ (propane) as a source gas. Here, for example, N or P is preferably introduced as an n-type impurity. Thus, n⁻ SiC layer 12 containing the n-type impurity at concentration lower than concentration of the n-type impurity contained in $n^+$ SiC substrate 11 can be formed. Specifically, the concentration of the n-type impurity in n⁻ SiC layer 12 is, for example, preferably not lower than $5 \times 10^{15}$ cm⁻³ and not higher than $5 \times 10^{16}$ cm⁻³.

Figure 5:
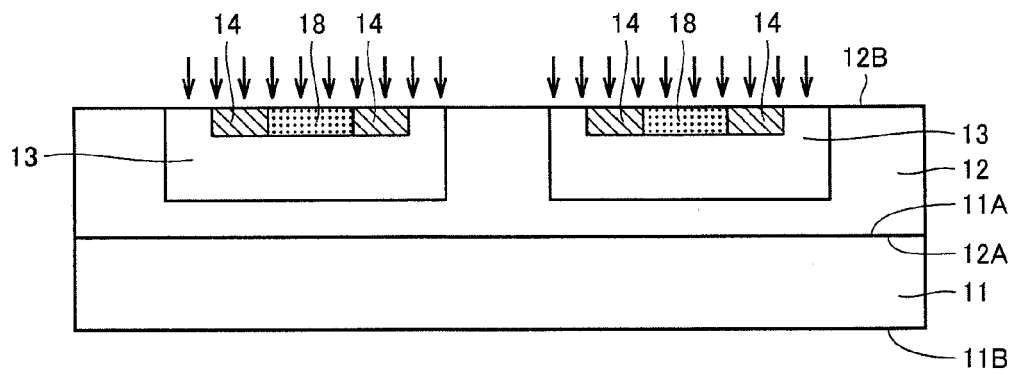
FIG. 5 is a schematic cross-sectional view for illustrating the method of manufacturing the MOSFET in the first embodiment.

Next, referring to FIG. 2, a p body formation step (S21) is performed. In this step (S21), referring to FIG. 5, a second-conductivity-type region having the second conductivity type is formed so as to include the second main surface 12B of n⁻ SiC layer 12, which is the main surface opposite to the first main surface 12A which is the main surface on the $n^+$ SiC substrate 11 side. Specifically, initially, an oxide film composed of $SiO_2$ is formed on the second main surface 12B, for example by CVD (Chemical Vapor Deposition). Then, after a resist is applied onto the oxide film, exposure and development are performed to thereby form a resist film having an opening in a region in conformity with a desired shape of p body 13 serving as the second-conductivity-type region. Using the resist film as a mask, the oxide film is partially removed, for example through RIE (Reactive Ion Etching), and a mask layer formed of the oxide film having an opening pattern is formed on n⁻ SiC layer 12. Thereafter, the above resist film is removed. Then, using this mask layer as a mask, ion implantation of a p-type impurity such as Al into n⁻ SiC layer 12 is performed, to thereby form p body 13 in n⁻ SiC layer 12. It is to be noted that a plurality of downward arrows included in FIG. 5 indicate a direction of ion implantation.

Next, referring to FIG. 2, an $n^+$ region formation step (S22) is performed. In this step (S22), a high-concentration first-conductivity-type region containing an impurity having the first conductivity type at concentration higher than that in n⁻ SiC layer 12 is formed in a region within p body 13 including the second main surface 12B. Specifically, referring to FIG. 5, initially, after the above oxide film used as the mask in the step (S21) is removed, a mask layer having an opening in a region in conformity with a desired shape of $n^+$ source region 14 is formed in accordance with a procedure similar to the step (S21). Then, using this mask layer as a mask, an n-type impurity such as P is introduced into n⁻ SiC layer 12 through ion implantation, to thereby form $n^+$ source region 14.

Next, referring to FIG. 2, a $p^+$ region formation step (S23) is performed. In this step (S23), referring to FIG. 5, $p^+$ region 18 is formed to include the second main surface 12B in the region sandwiched by a pair of $n^+$ source regions 14 within each of a pair of p bodies 13. Specifically, referring to FIG. 5, a mask layer having an opening in a region in conformity with a desired shape of $p^+$ region 18 is formed in accordance with a procedure similar to the steps (S21) and (S22), and using this mask layer as a mask, a p-type impurity such as Al or B is introduced into n⁻ SiC layer 12 through ion implantation, to thereby form $p^+$ region 18.

Next, referring to FIG. 2, an activation annealing step (S31) is performed. In this step (S31), activation annealing which is heat treatment for activating the impurity introduced through ion implantation above is performed, for example, by heating n⁻ SiC layer 12 into which ions have been implanted to approximately 1700° C. in an Ar (argon) atmosphere and holding the layer for approximately 30 minutes.

Figure 6:
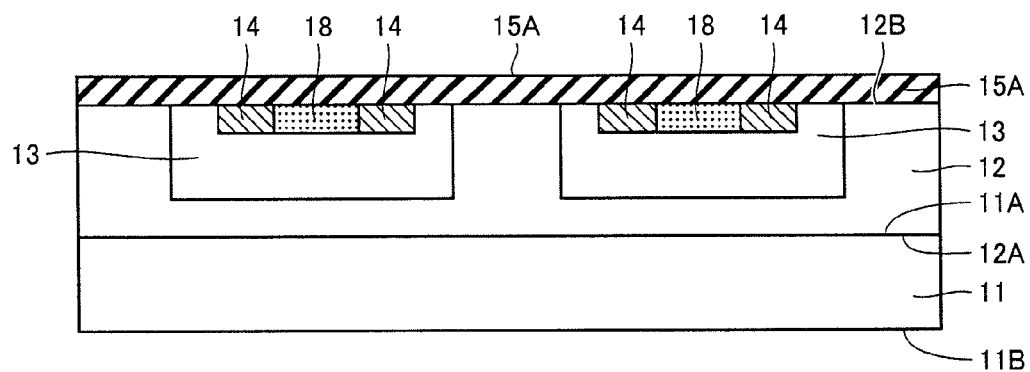
FIG. 6 is a schematic cross-sectional view for illustrating the method of manufacturing the MOSFET in the first embodiment.

Next, referring to FIG. 2, a thermal oxidation step (S32) is performed. In this step (S32), referring to FIG. 6, $n^+$ SiC substrate 11 on which n⁻ SiC layer 12 including a desired ion implantation region has been formed through the steps (S10) to (S31) is subjected to thermal oxidation. Thermal oxidation can be performed, for example, by heating $n^+$ SiC substrate 11 to approximately 1300° C. in an oxygen atmosphere and holding the substrate for approximately 10 minutes. Thus, a thermal oxidation film 15A to serve as gate oxide film 15 (see FIG. 1) composed of silicon dioxide ($SiO_2$) (for example, having a thickness of approximately 30 nm to 50 nm) is formed on the second main surface 12B.

In the thermal oxidation step (S32), dry oxidation performed in an oxygen atmosphere may be employed as described above, however, for example, wet oxidation in which heating is performed in an oxygen atmosphere containing vapor or pyrogenic oxidation in which hydrogen and oxygen are mixed and combusted to produce water may be employed. In addition, thermal oxidation film 15A formed by the thermal oxidation step (S32) may be subjected to annealing as additional treatment. In this annealing, it is preferable to perform heating, for example, at a temperature of not lower than 1000° C. and not higher than 1300° C., for not less than 3 minutes and not more than 3 hours, in an NO (nitric oxide) atmosphere, an $N_2O$ (nitrous oxide) atmosphere, an Ar atmosphere, or an $H_2$ (hydrogen) atmosphere.

Next, referring to FIG. 2, a gate electrode formation step (S40) is performed. In this step (S40), referring to FIG. 7, for example, gate electrode 17 composed of polysilicon, Al, or the like as a conductor is formed in contact with thermal oxidation film 15A so as to extend from one of n+ source regions 14 formed within one p body 13 to the upper surface of one of n+ source regions 14 formed within the other p body 13 arranged at the position adjacent to the above p body 13 with regard to the direction in which the second main surface 12B extends. Although the above description relates to gate electrode 17 located at the center of FIG. 1, the same applies to, for example, gate electrodes 17 formed on the right side and on the left side of FIG. 1. If polysilicon is adopted as a material for the gate electrode, the polysilicon can contain P at high concentration exceeding $1 \times 10^{20}$ cm$^{-3}$.

Figure 7:
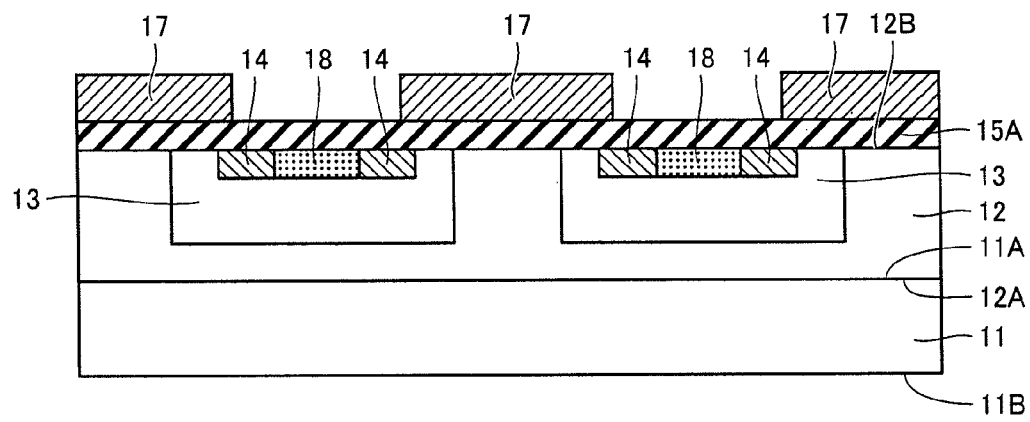
FIG. 7 is a schematic cross-sectional view for illustrating the method of manufacturing the MOSFET in the first embodiment.

Gate electrode 17 is formed by depositing a thin film composed of, for example, polysilicon to be in contact with thermal oxidation film 15A (i.e., substantially all over a main surface of thermal oxidation film 15A on a side not facing n+ SiC substrate 11), using for example the CVD method, and thereafter performing etching to obtain a pattern shown in FIG. 7. After a resist is applied onto the formed thin film, exposure and development are performed to form a resist film having an opening in a region in conformity with a desired shape of gate electrode 17. Then, using the resist film as a mask, the thin film is partially removed, for example through RIE (Reactive Ion Etching), to thereby form gate electrode 17 having an opening pattern in a desired region.

Alternatively, a lift-off method may be used, which includes the steps of forming beforehand a mask layer having an opening in a region in conformity with a shape of gate electrode 17, depositing the thin film composed of polysilicon described above on the mask layer and over the region serving as the opening in the mask layer, and thereafter removing the mask layer to form a pattern of gate electrode 17 in a desired region.

Figure 8:
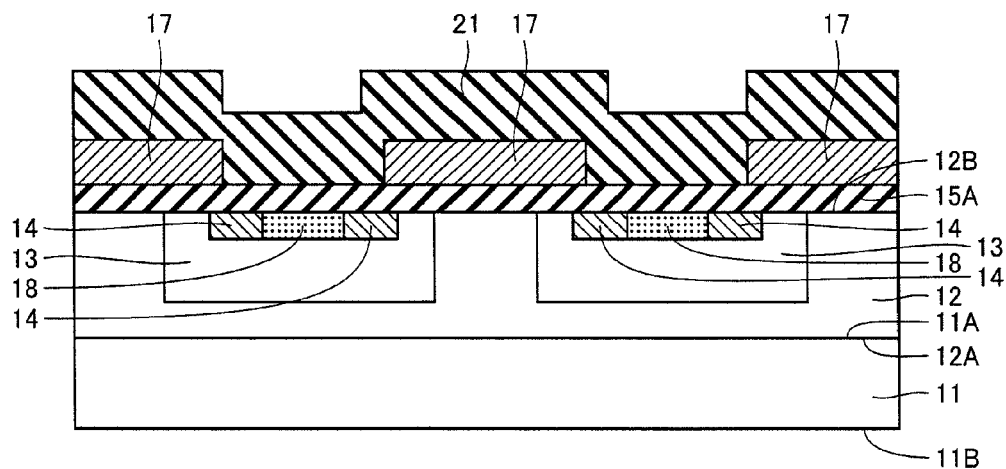
FIG. 8 is a schematic cross-sectional view for illustrating the method of manufacturing the MOSFET in the first embodiment.

Next, referring to FIG. 2, an interlayer insulating film formation step (S50) is performed. In this step (S50), referring to FIG. 8, an oxide film composed of SiO$_2$ is formed, for example by CVD (Chemical Vapor Deposition). Here, an interlayer insulating film 21 having a thickness of, for example, approximately 1 µm is formed, in particular by using plasma CVD, to be in contact with the surfaces of thermal oxidation film 15A and gate electrode 17.

Figure 9:
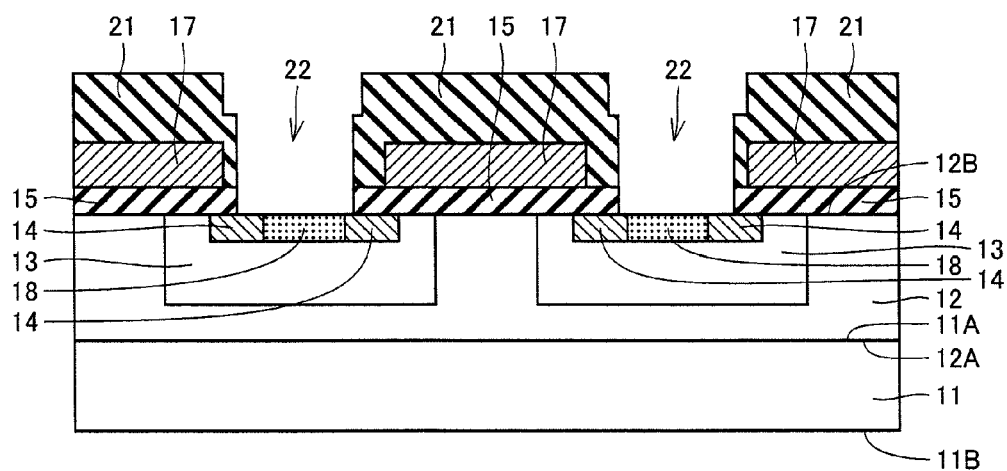
FIG. 9 is a schematic cross-sectional view for illustrating the method of manufacturing the MOSFET in the first embodiment.

Next, referring to FIG. 2, a source electrode portion opening step (S60) is performed. In this step (S60), interlayer insulating film 21 formed in the step (S50) and thermal oxidation film 15A are partially removed. Namely, in the step (S60), interlayer insulating film 21 in a region where source contact electrode 16 is to be formed in a later step is removed. Specifically, referring to FIG. 9, it is preferable to remove a portion of thermal oxidation film 15A that is in contact with each of n+ source region 14 and p+ region 18 formed within a pair of p bodies 13, and interlayer insulating film 21 in contact with thermal oxidation film 15A described above. This is because source contact electrode 16 is formed to extend from n+ source region 14 to p+ region 18 arranged in contact therewith and the other n+ source region 14, in a manner in contact with these regions, as shown in FIG. 1.

The treatment described above is performed by the following procedure. Initially, after a resist is applied onto interlayer insulating film 21, exposure and development are performed to thereby form a resist film having an opening in a region in conformity with a desired shape of interlayer insulating film 21. Then, using the resist film as a mask, interlayer insulating film 21 is partially removed, for example through RIE (Reactive Ion Etching), to thereby form interlayer insulating film 21 having an opening pattern in a desired region. The region from which interlayer insulating film 21 has been partially removed is formed as a contact hole 22 shown in FIG. 9. In contact hole 22, a main surface of p+ region 18 and a partial region of a main surface of n+ source region 14 are exposed. Further, thermal oxidation film 15A is partially removed through RIE, to thereby form gate oxide film 15 shown in FIG. 9.

Figure 3:
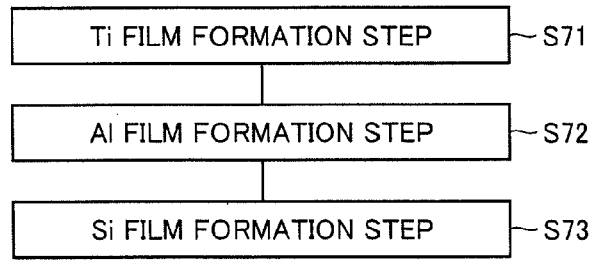
FIG. 3 is a flowchart showing details of an ohmic electrode material formation step in FIG. 2.

Next, referring to FIG. 2, an ohmic electrode material formation step (S70) is performed. In this step (S70), a Ti film 51 composed of Ti, an Al film 52 composed of Al, and a Si film 53 composed of Si, as a conductor layer which will become an ohmic electrode, that is, source contact electrode 16 (ohmic contact electrode), are formed in this order. Specifically, referring to FIG. 10, Ti film 51, Al film 52, and Si film 53 described above are formed in this order, for example by sputtering, on the second main surface 12B, particularly within contact hole 22 (on the main surface of p+ region 18 and the main surface of n+ source region 14 that are exposed), as well as on an upper main surface of interlayer insulating film 21. Referring to FIG. 3, a Ti film formation step, an Al film formation step, and a Si film formation step are performed in this order, as steps (S71) to (S73).

Figure 10:
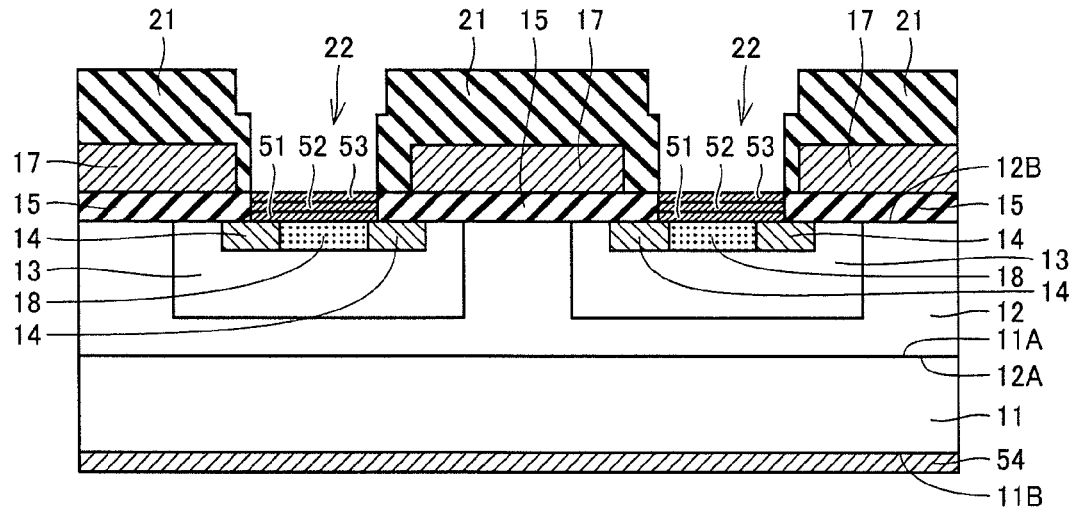
FIG. 10 is a schematic cross-sectional view for illustrating the method of manufacturing the MOSFET in the first embodiment.

Thereafter, a resist is applied onto Si film 53 within contact hole 22 and Si film 53 on interlayer insulating film 21. Then, exposure and development are performed on the applied resist to thereby form a resist film having an opening in conformity with a desired shape of Si film 53. Using the resist film as a mask, Si film 53 is partially removed, for example through RIE (Reactive Ion Etching), to thereby form Si film 53 having an opening pattern in a desired region. Preferably, Si film 53 on interlayer insulating film 21 is removed together with the resist, and Si film 53 within contact hole 22 remains. It is to be noted that, in a region from where Si film 53 is removed such as on interlayer insulating film 21, Al film 52 and Ti film 51 are also removed. Further, in a region in which Si film 53 remains such as within contact hole 22, Al film 52 and Ti film 51 also remain. Thus, as shown in FIG. 10, Ti film 51, Al film 52, and Si film 53 are formed only on the main surface of p+ region 18 and the main surface of n+ source region 14 that are exposed within contact hole 22.

Alternatively, a lift-off method may be used, which includes the steps of forming beforehand a mask layer having an opening in a region in conformity with a shape of Ti film 51, Al film 52, and Si film 53, depositing Si film 53, Al film 52, and Ti film 51 described above on the mask layer and over the region serving as the opening in the mask layer, and thereafter removing the mask layer to form a pattern of Si film 53, Al film 52, and Ti film 51 in a desired region (on the main surface of p+ region 18 and the main surface of n+ source region 14 that are exposed).

Here, in the step (S71), Ti film 51 having a thickness of not smaller than 100 Å and not greater than 400 Å is preferably formed. Thus, an ohmic contact electrode having low resistance in a stable manner can be formed. In addition, in the step (S72), Al film 52 at least 1.5 times and at most 6 times as thick as Ti film 51 formed in the step (S71) is preferably formed. Thus, source contact electrode 16 further reliably achieving low contact resistance with n+ source region 14 and p body 13 can be fabricated. Moreover, in the step (S73), Si film 53 having a thickness of not smaller than 100 Å and not greater than 500 Å is preferably formed. Thus, an ohmic contact electrode having low resistance in a stable manner can be formed.

Further, in the ohmic electrode material formation step (S70), an Ni film 54 is preferably formed in addition to Ti film 51, Al film 52, and Si film 53 described above. Referring to FIG. 10, Ni film 54 for forming a back surface electrode (drain electrode) is formed on the main surface of n+ SiC substrate 11 on a side opposite to n− SiC layer 12, for example by sputtering. The step of forming Ni film 54 may be performed before the steps of forming Ti film 51, Al film 52, and Si film 53, or after the steps of forming Ti film 51, Al film 52, and Si film 53. Alternatively, for example, Ni film 54 may be formed after forming Ti film 51 and before forming Al film 52. Ni film 54 may be formed after forming Al film 52 and before forming Si film 53.

Preferably, Ni film 54 has a thickness of, for example, not smaller than 800 Å and not greater than 1200 Å, preferably not smaller than 900 Å and not greater than 1100 Å, for example 1000 Å. Thus, an ohmic drain electrode having low resistance in a stable manner can be formed.

Figure 11:
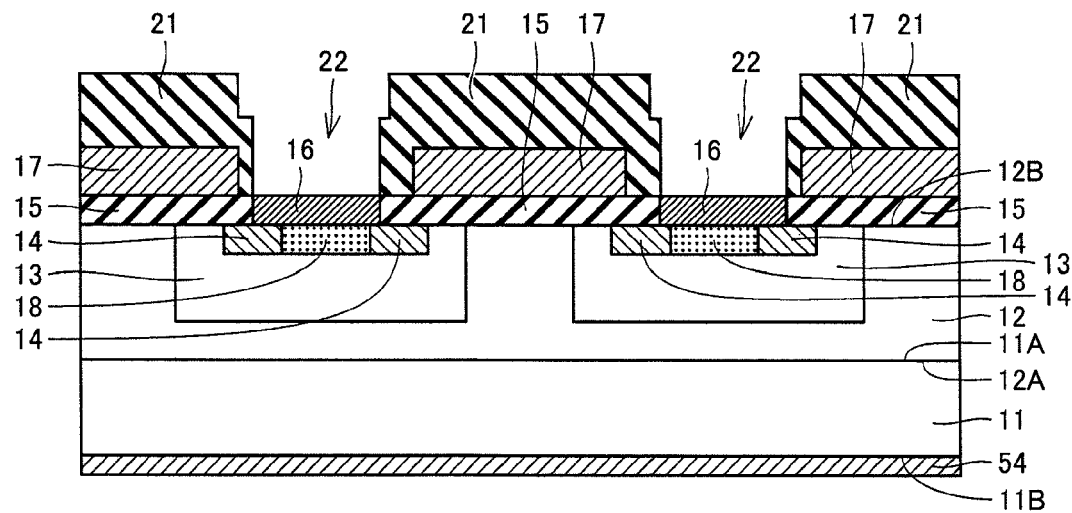
FIG. 11 is a schematic cross-sectional view for illustrating the method of manufacturing the MOSFET in the first embodiment.

Next, referring to FIG. 2, an alloying treatment step (S80) is performed. Specifically, referring to FIGS. 10 and 11, $n^+$ SiC substrate 11 for which the procedure above has been completed is heated to a temperature of not lower than 550° C. and not higher than 1200° C., preferably not lower than 900° C. and not higher than 1100° C., for example 1000° C., in an atmosphere of an inert gas such as Ar, and held for a time period not longer than 10 minutes, for example, for 2 minutes. Through this heat treatment, Ti, Al, and Si contained in Ti film 51, Al film 52, and Si film 53 respectively as well as C contained in $n^-$ SiC layer 12 or $n^+$SiC substrate 11 are alloyed. Consequently, as shown in FIG. 11, source contact electrode 16 extending from one of a pair of $n^+$ source regions 14 arranged within each of a pair of p bodies 13, to $p^+$ region 18 arranged in contact therewith and the other $n^+$ source region 14, in a manner in contact with these regions, is formed. Further, Ni film 54 is alloyed simultaneously through the heating above, to become a drain electrode. Here, in the step (S80), $n^+$ SiC substrate 11 is preferably heated in a gas mixture of an inert gas, in particular Ar and/or $N_2$, and hydrogen. Thus, source contact electrode 16, with its contact resistance with $n^+$ source region 14 and p body 13 ($p^+$ region 18) being further reliably lowered and manufacturing cost being suppressed, can be fabricated. Through the above procedure, the step (S80) is completed.

In a case where $n^+$ SiC substrate 11 is temporarily taken out of a furnace in which the step (S80) has been performed and exposed to the air (i.e., an atmosphere containing oxygen) in order to proceed to the step (S90) as a subsequent step, it is preferable to confirm that $n^+$ SiC substrate 11 has been cooled down to 100° C. or lower, and then discharge $n^+$ SiC substrate 11 into the air. In the foregoing, it is more preferable to confirm that $n^+$ SiC substrate 11 has been cooled down to 60° C. or lower, for example 50° C., and then discharge $n^+$ SiC substrate 11 into the air. This can suppress oxidation of the vicinity of a main surface of source contact electrode 16 and resultant formation of a high-resistance layer.

Further, Ni film 54 for forming the back surface electrode (drain electrode) in the step (S70) described above may be formed after the step (S80) is performed. In this case, after Ni film 54 is formed, $n^+$ SiC substrate 11 is preferably heated to a temperature of not lower than 550° C. and not higher than 1200° C., preferably not lower than 900° C. and not higher than 1100° C., for example 1000° C., in an atmosphere of an inert gas such as Ar, and held for a time period not longer than 10 minutes, for example, for 2 minutes, as described above. However, in this case, in order to enhance treatment efficiency, it is preferable to simultaneously perform heat treatment on Ti film 51, Al film 52, and Si film 53 formed in the step (S70) and heat treatment on Ni film 54. Namely, it is preferable to form Ti film 51, Al film 52, Si film 53, and Ni film 54 in the step (S70) and thereafter perform heat treatment for alloying in the step (S80).

Next, referring to FIG. 2, a back surface electrode pad formation step (S90) is performed. In this step (S90), for example, an Ni layer and an Au (gold) layer serving as a back surface electrode pad are formed in this order on a main surface of Ni film 54 as the drain electrode on a side opposite to $n^+$ SiC substrate 11.

Figure 12:
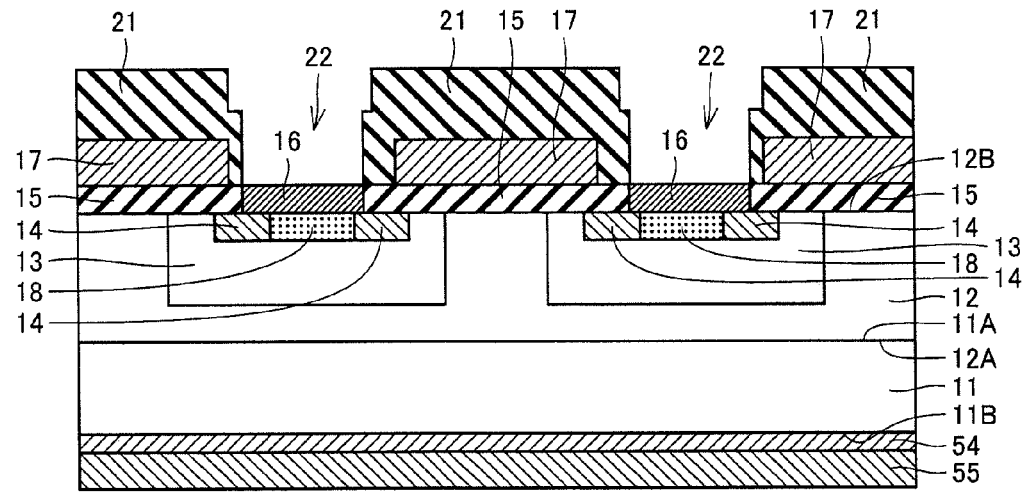
FIG. 12 is a schematic cross-sectional view for illustrating the method of manufacturing the MOSFET in the first embodiment.

Specifically, referring to FIG. 12, the Ni layer and the Au layer are vapor-deposited in this order, for example by sputtering, on the main surface of Ni film 54 on the side opposite to $n^+$ SiC substrate 11, and thus the Ni layer and the Au layer together form a back surface electrode pad 55. By vapor-depositing the Ni layer and the Au layer in this order, good adhesion property and ohmic property can be formed at a contact interface between Ni film 54 and back surface electrode pad 55. It is to be noted that the Ni layer has a thickness of preferably not smaller than 30 nm and not greater than 70 nm and further preferably not smaller than 40 nm and not greater than 60 nm among others, for example, 50 nm. The Au layer has a thickness of preferably not smaller than 200 nm and not greater than 700 nm and further preferably not smaller than 400 nm and not greater than 600 nm among others, for example, 500 nm.

By setting the thickness condition as above, back surface electrode pad 55 above can form an ohmic drain electrode having low resistance in a stable manner, for example as a result of good adhesion between the Ni layer and the Au layer, or good adhesion between the Ni layer of back surface electrode pad 55 and Ni film 54 formed in the step (S70). It is to be noted that, in order to improve adhesion property between the Ni layer and the Au layer and adhesion property between Ni film 54 and back surface electrode pad 55, heat treatment is preferably performed on $n^+$ SiC substrate 11 after back surface electrode pad 55 is formed. Specifically, $n^+$ SiC substrate 11 is heated to a temperature of not lower than 300° C. and not higher than 500° C., preferably not lower than 350° C. and not higher than 450° C., for example 400° C., in an atmosphere of an inert gas such as Ar, and held for a time period not longer than 60 minutes, for example, for 20 minutes.

Next, referring to FIG. 2, a gate electrode portion opening step (S100) is performed. In this step (S100), interlayer insulating film 21 on a portion of gate electrode 17 constituting a gate liner is removed to form an opening.

Of MOSFETs 1 shown in FIG. 1, gate electrode 17 at the center sandwiched between a pair of right and left p bodies 13 constitutes one MOSFET 1, together with source contact electrodes 16 on the both sides thereof. Gate electrodes 17 on the right side and the left side of FIG. 1 have a function as gate liners for stabilizing a gate potential of adjacent MOSFETs 1 within MOSFETs 1 shown in FIG. 1 (i.e., a device in which the same pattern is periodically repeated in a main surface direction). Since polysilicon has a resistance higher than that of a metal, in a large-area device with a main surface having a large area, there occurs a significant reduction in potential caused by polysilicon between MOSFET 1 at a gate potential application portion (for example, an electrical signal outlet such as a bonding pad) and MOSFET 1 apart from the gate potential application portion, leading to an unstable gate potential. Thus, an opening is formed in a partial region in the device and a metal wire is provided to establish connection with the gate potential application portion. In this way, the gate potential is stabilized in the entire main surface of the device. Although gate liners arranged at a short distance to sandwich one MOSFET 1 are shown in FIG. 13, gate liners are generally arranged to surround the outermost periphery of a main surface of a device.

Namely, a plurality of MOSFETs 1 identical to MOSFET 1 at the center are aligned at a right end portion and a left end portion of FIG. 1, and gate electrodes 17 on the right side and the left side of FIG. 1 electrically connect these MOSFETs, and thus stabilize the gate potential of MOSFETs 1. By removing a portion of interlayer insulating film 21 formed on a main surface of gate electrode 17 used as a gate liner as described above, an electrical signal can be extracted from gate electrode 17 used as a gate liner.

Figure 13:
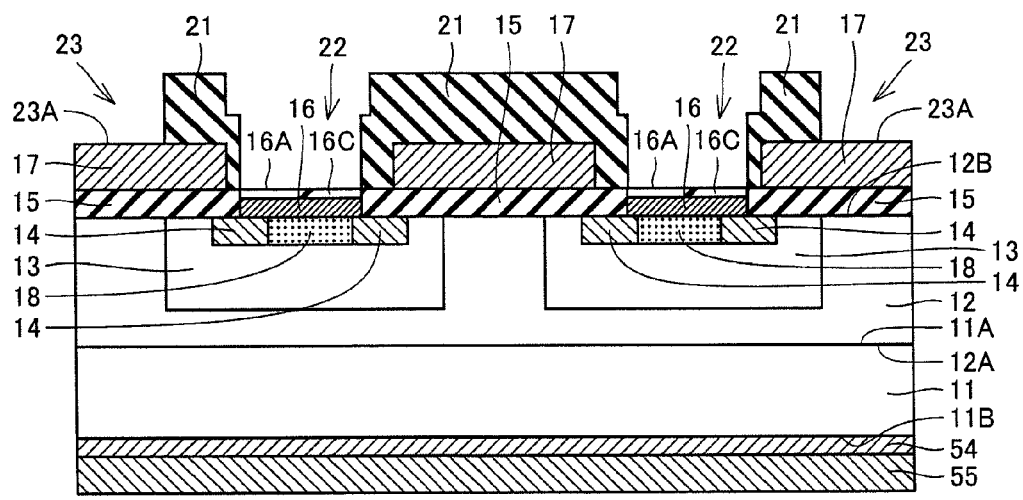
FIG. 13 is a schematic cross-sectional view for illustrating the method of manufacturing the MOSFET in the first embodiment.

Specifically, referring to FIG. 13, a portion of interlayer insulating film 21 arranged in contact with gate electrodes 17 which surround gate electrode 17 constituting one MOSFET 1 as described above from outside is removed. For this treatment, initially, after a resist is applied onto interlayer insulating film 21, exposure and development are performed to thereby form a resist film having an opening in a region in conformity with a desired shape of interlayer insulating film 21. Then, using the resist film as a mask, interlayer insulating film 21 is partially removed, for example through RIE (Reactive Ion Etching), to thereby form interlayer insulating film 21 having an opening pattern in a desired region. Thus, a gate contact hole 23 serving as an opening from which interlayer insulating film 21 has been removed as shown in FIG. 13 is formed.

Next, referring to FIG. 2, a high-resistance layer removal step (S110) is performed. In this step (S110), a high-resistance layer formed in a region where an electrode is to be formed is removed. Specifically, referring to FIG. 13, for example, of source contact electrode 16 for forming a source electrode, a region with a certain depth from a main surface thereof on a side opposite to n⁻ SiC layer 12 is removed.

Even if oxidation of an electrode main surface 16A of source contact electrode 16 after formation of source contact electrode 16 in the step (S80) can be suppressed, for example in the step (S90) described above, a region with a certain depth from electrode main surface 16A of source contact electrode 16 in FIG. 13 is oxidized by drying/baking in the air for drying n⁺ SiC substrate 11 in the air, and heat treatment for improving adhesion property of formed back surface electrode pad 55. The region with a certain depth from electrode main surface 16A of source contact electrode 16 in FIG. 13 is also oxidized by n⁺ SiC substrate 11 in a state heated by heat treatment in the step (S90) being exposed to the air when n⁺ SiC substrate 11 goes through the step (S90) and proceeds to the step (S100). Further, in the step (S100) described above, the vicinity of the main surface of the source contact electrode is oxidized by oxygen plasma ashing performed to remove the resist used to partially remove interlayer insulating film 21.

The same applies to an electrode main surface 23A in gate contact hole 23 formed in the step (S100). Electrode main surface 23A may also be oxidized by oxygen plasma ashing. Accordingly, a region with a certain depth from electrode main surface 23A is oxidized.

The oxidized regions formed in the vicinity of electrode main surface 16A and electrode main surface 23A are each a high-resistance layer having an electrical resistance higher than that of other regions in, for example, source contact electrode 16. Therefore, if such a high-resistance layer is formed in, for example, source contact electrode 16, it is difficult to obtain good ohmic contact in electrode main surface 16A of source contact electrode 16. Similarly, in a case where a high-resistance layer is formed in gate contact hole 23, it is difficult to obtain good ohmic contact in an electrode to be formed. Thus, if a metal electrode is formed on electrode main surface 16A, 23A having a high-resistance layer formed therein, there is a possibility that property of an electrical signal input to/output from the metal electrode may be deteriorated or fluctuate.

Figure 14:
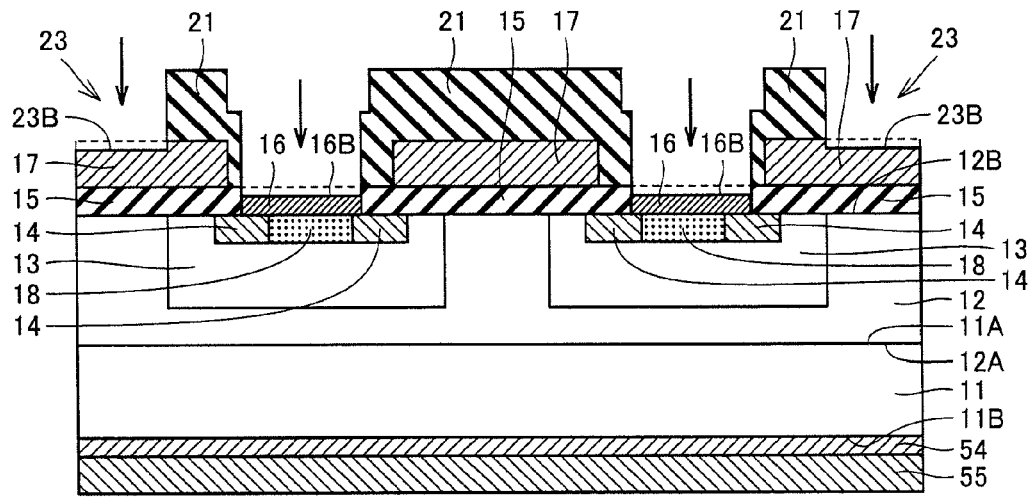
FIG. 14 is a schematic cross-sectional view for illustrating the method of manufacturing the MOSFET in the first embodiment.

Therefore, in the step (S110), the high-resistance layer removal step described above is performed. Specifically, referring to FIG. 13, for example, reverse sputtering is performed on electrode main surface 16A of source contact electrode 16 and on electrode main surface 23A in gate contact hole 23. Specifically, for example, an inert gas such as Ar (argon) ionized in a reduced-pressure atmosphere is applied onto electrode main surface 16A and electrode main surface 23A. Thereby, the ionized inert gas collides with the high-resistance layer formed in electrode main surface 16A and electrode main surface 23A, and a high-resistance layer 16C is knocked off from electrode main surface 16A and electrode main surface 23A by collision energy. Therefore, high-resistance layer 16C is removed from electrode main surface 16A and electrode main surface 23A, and electrode main surfaces 16B, 23B serve as uppermost surfaces as shown in FIG. 14. It is to be noted that dotted lines above source contact electrode 16 and above right and left gate electrodes 17 in FIG. 14 respectively indicate electrode main surfaces 16A and 23A before the high-resistance layer is removed. Further, a plurality of downward arrows included in FIG. 14 indicate a direction of sputtering.

It is to be noted that, in order to remove a high-resistance layer in the step (S110), for example, dry etching may be performed instead of reverse sputtering described above. For example, in the case of removing a high-resistance layer in electrode main surface 16A, since the high-resistance layer is made of a material formed by oxidizing an alloy composed of Ti, Al, Si, and C, it is preferable to use a noble gas such as Ar as an etching gas for removing the high-resistance layer. In addition, for example, a fluorine-based gas such as $CF_4$ can be used to remove a high-resistance layer as well as to clean electrode main surfaces 16B, 23B exposed by the removal of the high-resistance layer.

Next, referring to FIG. 2, a front surface electrode pad formation step (S120) is performed. In this step (S120), a metal layer serving as a front surface electrode pad is formed on the electrode main surface from which the high-resistance layer has been removed in the step (S110). It is to be noted that the step (S120) is preferably performed immediately after removing the high-resistance layer in source contact electrode 16 and the like in the step (S110). Thereby, the front surface electrode pad can be formed on electrode main surfaces 16B, 23B with no high-resistance layer formed therein. After the front surface electrode pad is formed, the main surface of source contact electrode 16 is not oxidized. Therefore, the step (S120) is preferably performed immediately after the high-resistance layer removal step (S110) is performed.

Figure 15:
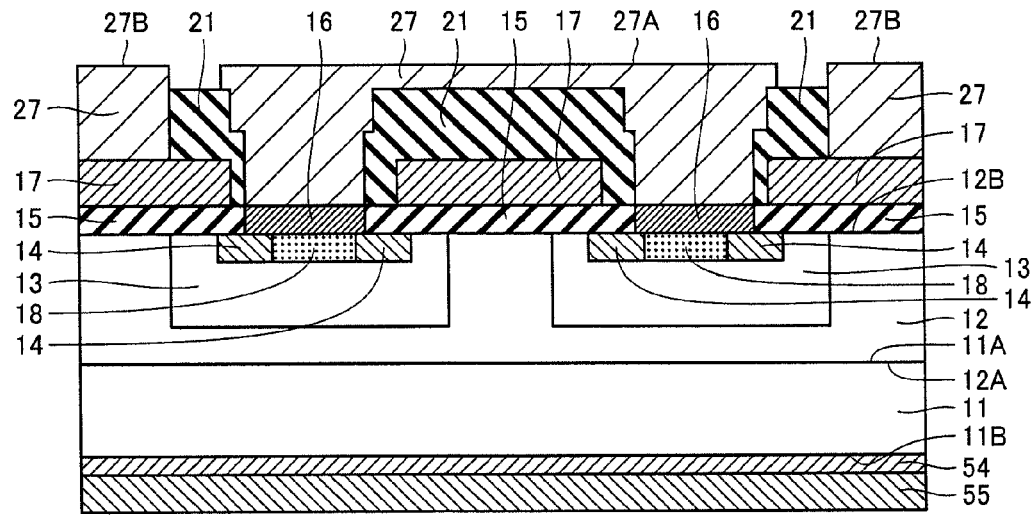
FIG. 15 is a schematic cross-sectional view for illustrating the method of manufacturing the MOSFET in the first embodiment.

Specifically, referring to FIG. 15, a thin film layer composed of Ti and Al is formed in this order, for example by sputtering, all over gate electrodes 17, source contact electrodes 16, and interlayer insulating film 21. Subsequently, after a resist is applied onto the thin film layer, exposure and development are performed to thereby form a resist film having an opening in a region in conformity with a desired shape of the thin film layer. Then, using the resist film as a mask, the thin film layer is partially removed, for example through RIE (Reactive Ion Etching), to thereby form a front surface electrode pad 27 having an opening pattern in a desired region. Here, Ti constituting front surface electrode pad 27 has a thickness of preferably not smaller than 30 nm and not greater than 70 nm and particularly preferably not smaller than 40 nm and not greater than 60 nm among others, for example, 50 nm. Similarly, Al constituting front surface electrode pad 27 has a thickness of preferably not smaller than 2.5 μm and particularly preferably not smaller than 4 μm, for example, 5 μm. It is to be noted that, in FIG. 15, a pad uppermost surface 27A of front surface electrode pad 27 at the center connecting a pair of source contact electrodes 16 and a pad uppermost surface 27B of front surface electrode pad 27 formed on gate electrodes 17 on the right and left sides of FIG. 15 have an equal height with regard to a vertical direction. However, this is due to simplification of the drawing, and actually the pad uppermost surfaces have different heights depending on the region.

The step (S120) is preferably performed consecutively immediately after performing the treatment of the step (S110), within the same furnace, without taking out n+ SiC substrate 11 in the air. However, when performing the step (S120), it is preferable to perform the treatment in a reduced-pressure atmosphere not containing oxygen. In the step (S120), the front surface electrode pad is preferably formed by sputtering. This can suppress occurrence of a phenomenon that electrode main surfaces 16B, 23B are oxidized from when the high-resistance layer is removed in the step (S110) to when front surface electrode pad 27 is formed in the step (S120). This can more reliably suppress occurrence of the phenomenon that electrode main surfaces 16B, 23B are oxidized.

If the treatment of the step (S120) is performed in a reduced-pressure atmosphere not containing oxygen as described above, there are no particular constraints on the temperature condition of the atmosphere. However, if the step (S120) is performed in an atmosphere containing oxygen, a region on which front surface electrode pad 27 is to be formed preferably has a temperature of 100° C. or lower, in order to suppress the region from which the high-resistance layer has been removed in the step (S110) from being oxidized again. It is to be noted that the temperature is more preferably 60° C. or lower.

Of front surface electrode pad 27 in FIG. 15 formed as described above, front surface electrode pad 27 including pad uppermost surface 27A at the center is an electrode connected to source contact electrodes 16 to control a source current. Further, of front surface electrode pad 27 in FIG. 15, front surface electrode pad 27 including pad uppermost surface 27B on the right and left sides is an electrode controlling a current of a gate liner serving as a metal wire for stabilizing the gate potential as described above.

Figure 16:
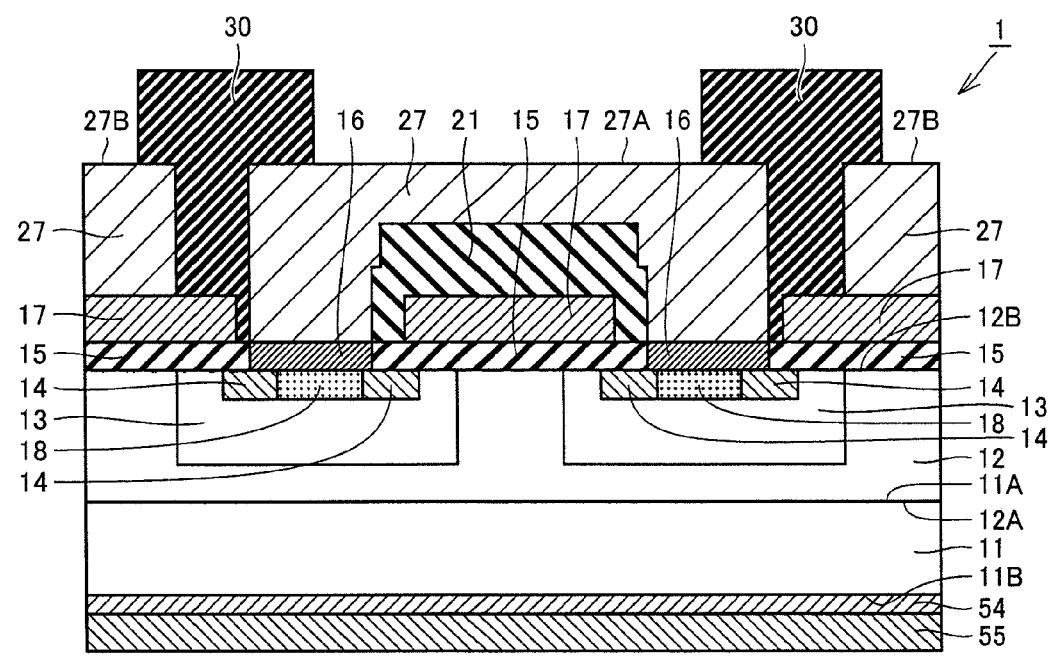
FIG. 16 is a schematic cross-sectional view showing a completed state of the MOSFET in the first embodiment.

Finally, referring to FIG. 2, a passivation film formation step (S130) is performed. In this step (S130), a passivation film serving as a protective film finally protecting MOSFET 1 from outside is formed. Specifically, referring to FIG. 15, a passivation film composed of $SiO_2$ is formed all over uppermost surfaces in FIG. 15 such as on pad uppermost surfaces 27A, 27B of front surface electrode pad 27 formed in the step (S120) and on interlayer insulating film 21, for example by plasma CVD. Subsequently, after a resist is applied onto the passivation film, exposure and development are performed to thereby form a resist film having an opening in a region in conformity with a desired shape of the passivation film. Then, using the resist film as a mask, the passivation film is partially removed, for example through RIE (Reactive Ion Etching), to thereby form a passivation film 30 having an opening pattern in a desired region as shown in FIG. 16.

In MOSFET 1 formed by the above procedure, front surface electrode pad 27 is formed, with the high-resistance layer in source contact electrode 16 and in gate electrode 17 in gate contact hole 23 having been removed in the step (S110). This can suppress increase in contact resistance between front surface electrode pad 27 and source contact electrode 16, or between front surface electrode pad 27 and gate electrode 17.

(Second Embodiment)

MOSFET 1 in a second embodiment includes main components shown in the schematic cross-sectional view in FIG. 1, as with MOSFET 1 in the first embodiment. However, the second embodiment is slightly different from the first embodiment with regard to the method of manufacturing MOSFET 1. Specifically, in order to suppress a high-resistance layer from being formed on the source contact electrode and on the gate electrode forming a gate liner due to oxidation, the step of forming a protective film on the electrodes described above is included. Hereinafter, a method of manufacturing MOSFET 1 in the present second embodiment will be described.

Figure 17:
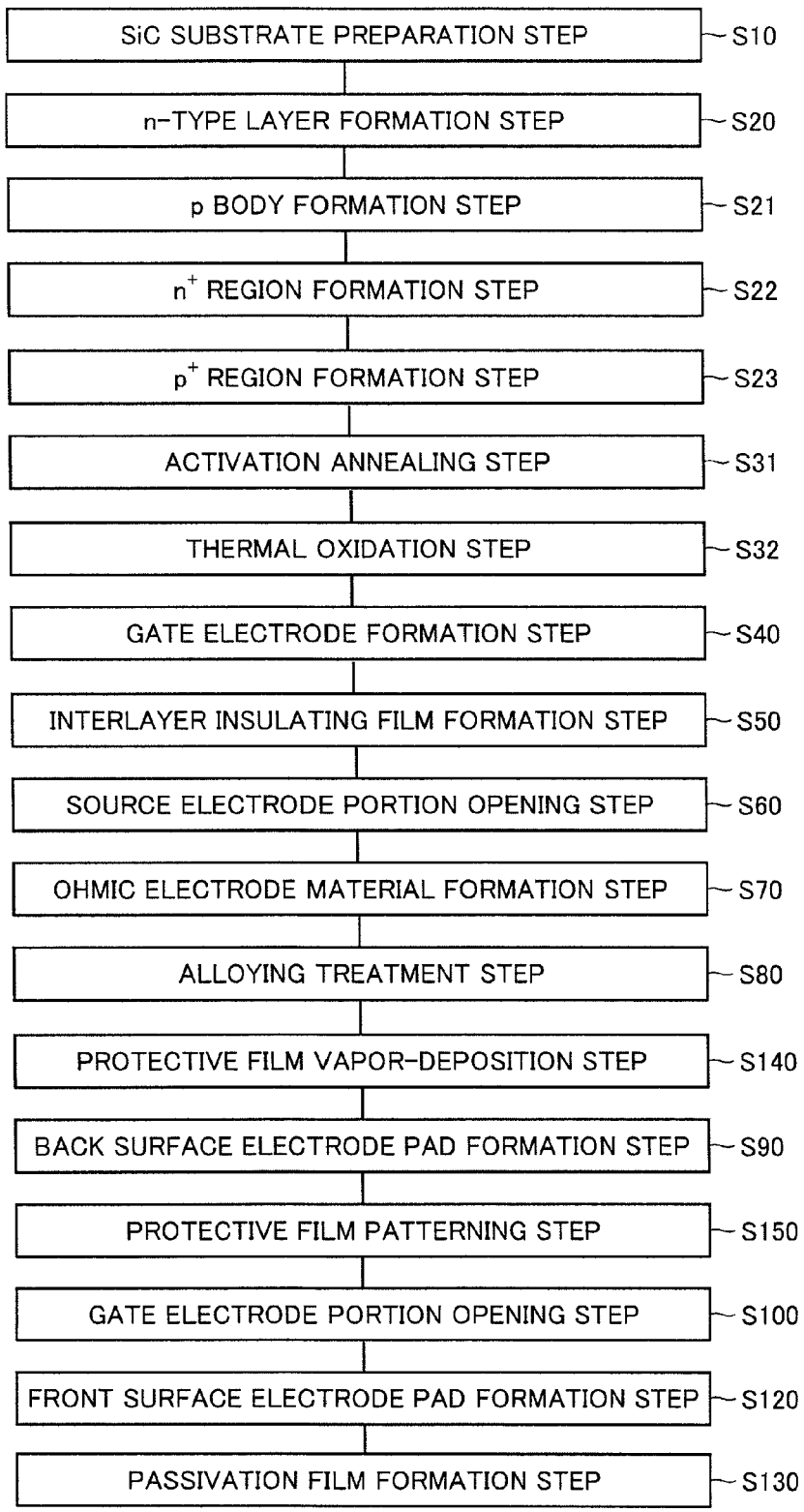
FIG. 17 is a flowchart showing an outline of a method of manufacturing a MOSFET in a second embodiment.

Referring to FIG. 17, the method of manufacturing the MOSFET in the second embodiment is in conformity with the method of manufacturing the MOSFET in the first embodiment (see FIG. 2), from the step (S10) to the step (S80). Also in the method of manufacturing the MOSFET in the second embodiment, when source contact electrode 16 as an alloy layer composed of Ti, Al, and Si is formed in the step (S70) and the step (S80), and thereafter n+ SiC substrate 11 is temporarily taken out of a furnace in which the step (S80) has been performed and exposed to the air in order to proceed to a subsequent step, it is preferable to confirm that n+ SiC substrate 11 has been cooled down to 100° C. or lower, and then discharge n+ SiC substrate 11 into the air. In the foregoing, it is more preferable to confirm that n+ SiC substrate 11 has been cooled down to 60° C. or lower, for example 50° C., and then discharge n+ SiC substrate 11 into the air.

Figure 18:
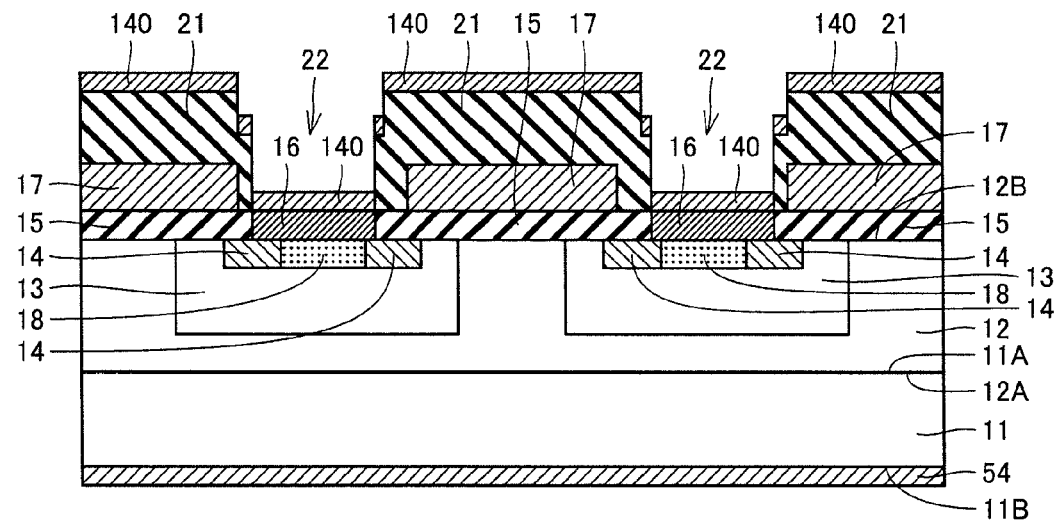
FIG. 18 is a schematic cross-sectional view for illustrating the method of manufacturing the MOSFET in the second embodiment.

In the manufacturing method in the second embodiment, referring to FIG. 17, a protective film vapor-deposition step (S140) is performed after the step (S80). In the step (S140), a protective film is formed to suppress formation of a high-resistance layer due to oxidation of the uppermost surface of source contact electrode 16 (electrode main surface 16A: see FIG. 13). Specifically, after source contact electrode 16 alloyed in the step (S80) is formed as shown in FIG. 11, a thin film layer is formed by sputtering, for example as in the step (S70), the step (S90), and the step (S120) described above. The thin film layer is preferably composed of Ti and W (tungsten), or Ti and Al. Here, Ti constituting front surface electrode pad 27 has a thickness of preferably not smaller than 30 nm and not greater than 70 nm and particularly preferably not smaller than 40 nm and not greater than 60 nm among others, for example, 50 nm. Similarly, W or Al constituting front surface electrode pad 27 has a thickness of preferably not smaller than 80 nm and not greater than 120 nm and particularly preferably not smaller than 90 nm and not greater than 110 nm among others, for example, 100 nm. As a result, as shown in FIG. 18, the thin film layer composed of Ti and W, or Ti and Al is formed as a protective film 140, on interlayer insulating film 21 and the like including the uppermost surface of source contact electrode 16.

A stack structure composed of Ti and W, or Ti and Al establishes good ohmic contact with the alloy composed of Ti, Al, Si, and C constituting source contact electrode 16 at a contact interface, and is also excellent in adhesion property. Thus, protective film 140 is preferably a stack structure composed of Ti and W, or Ti and Al. It is to be noted that Ti is preferably formed on source contact electrode 16 before W or Al is formed. This can further improve ohmic property and adhesion property between protective film 140 and source contact electrode 16.

In order to suppress oxidation of the main surface of alloyed source contact electrode 16 in the step (S140) described above, formation of protective film 140 by the step (S140) is preferably performed immediately after the alloying treatment in the step (S80) is finished. Formation of protective film 140 suppresses oxidation of the main surface of source contact electrode 16 and formation of a high-resistance layer. Further, the step (S140) is preferably performed at 100° C. or lower. This can more reliably suppress oxidation of the main surface of source contact electrode 16. Therefore, after protective film 140 is formed on the main surface of source contact electrode 16, n+ SiC substrate 11 may be placed in an atmosphere at 100° C. or higher. This is because, since protective film 140 is arranged on the main surface of source contact electrode 16, the main surface of source contact electrode 16 is not oxidized even if n+ SiC substrate 11 is placed in an atmosphere at 100° C. or higher.

Figure 19:
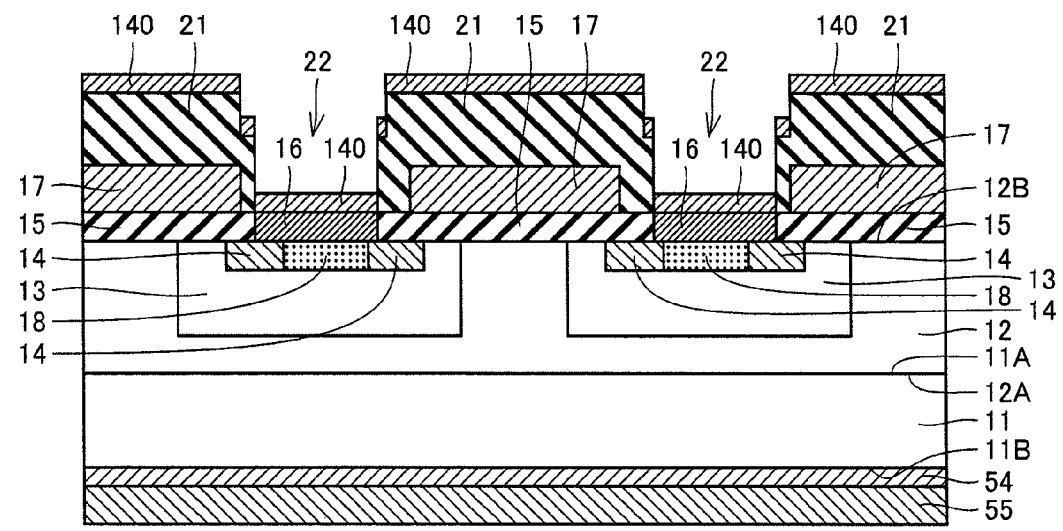
FIG. 19 is a schematic cross-sectional view for illustrating the method of manufacturing the MOSFET in the second embodiment.

Next, referring to FIG. 17, a back surface electrode pad formation step (S90) is performed. This step (S90) is identical to the step (S90) in the first embodiment. As a result, back surface electrode pad 55 in a state shown in FIG. 19 is formed.

Figure 20:
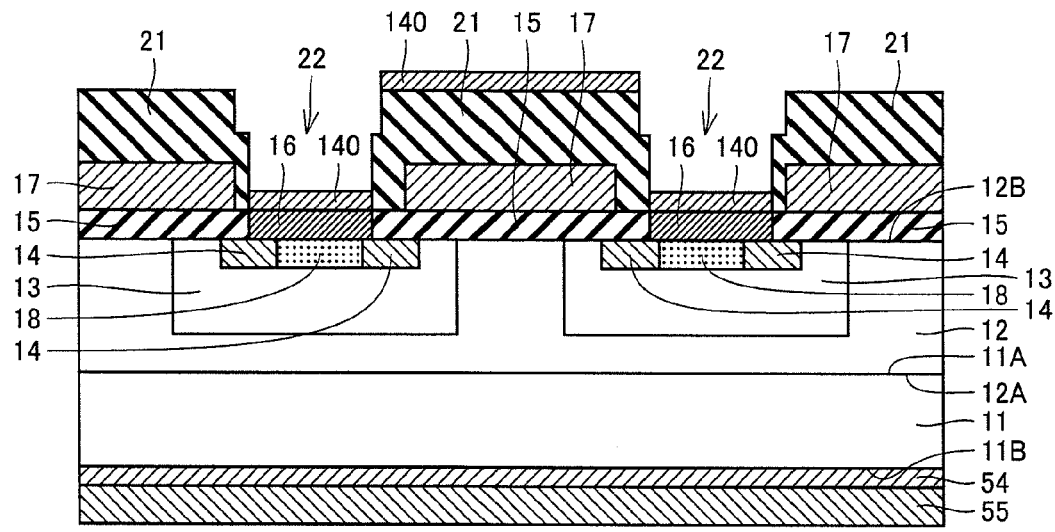
FIG. 20 is a schematic cross-sectional view for illustrating the method of manufacturing the MOSFET in the second embodiment.

Next, referring to FIG. 17, a protective film patterning step (S150) is performed. In the step (S150), a portion of protective film 140 formed in the step (S140) is removed. Specifically, after a resist is applied onto protective film 140, exposure and development are performed to thereby form a resist film having an opening in a region in conformity with a desired shape of protective film 140. Then, using the resist film as a mask, protective film 140 is partially removed, for example through RIE (Reactive Ion Etching), to thereby form protective film 140 having an opening pattern in a desired region as shown in FIG. 20. It is to be noted that the step (S90) and the step (S150) may be performed in reverse order.

As described above, protective film 140 is provided to suppress oxidation of particularly a region in the vicinity of electrode main surface 16A of source contact electrode 16 (see FIG. 13). Thus, referring to FIG. 20 showing a state after the step (S150) is performed, protective film 140 is preferably arranged in contact with source contact electrode 16. However, there is no need to arrange protective film 140 on a region other than the uppermost surface of source contact electrode 16. In contrast, it is preferable to remove protective film 140 on gate electrodes 17 on the right and left sides shown in FIG. 20. If protective film 140 remains formed in an opening in interlayer insulating film 21 and around the periphery thereof, protective film 140 may affect the RIE step for interlayer insulating film 21 in a later step. Further, if protective film 140 remains formed in an opening in interlayer insulating film 21 and around the periphery thereof, a short circuit may occur between gate electrode 17 and a source electrode. (If protective film 140 remains formed on gate electrodes 17 on the right and left sides shown in FIG. 20, when the front surface electrode pad serving as a gate liner is formed in a later step, protective film 140 is arranged at a position sandwiched between the front surface electrode pad serving as a gate liner and source contact electrode 16 of adjacent MOSFET 1, and a short circuit may occur, because protective film 140 is a metal thin film.)

However, protective film 140 on interlayer insulating film 21 arranged between a pair of source contact electrodes 16 (i.e., at the center in FIG. 20) may be left as shown in FIG. 20 without being removed in the step (S150), or may be removed. Interlayer insulating film 21 at the center in FIG. 20 is not removed to form a gate liner in a later step. This region is a place where there is no need to form an opening in interlayer insulating film 21 in a later step. Thus, this region does not affect etching of interlayer insulating film 21. Further, this region is a region where the front surface electrode pad composed of Ti and Al is to be formed in a later step (the front surface electrode pad formation step (S120)). Namely, presence or absence of protective film 140 in this region does not affect a later step. Therefore, protective film 140 on interlayer insulating film 21 arranged at the center in FIG. 20 does not necessarily have to be removed.

Figure 21:
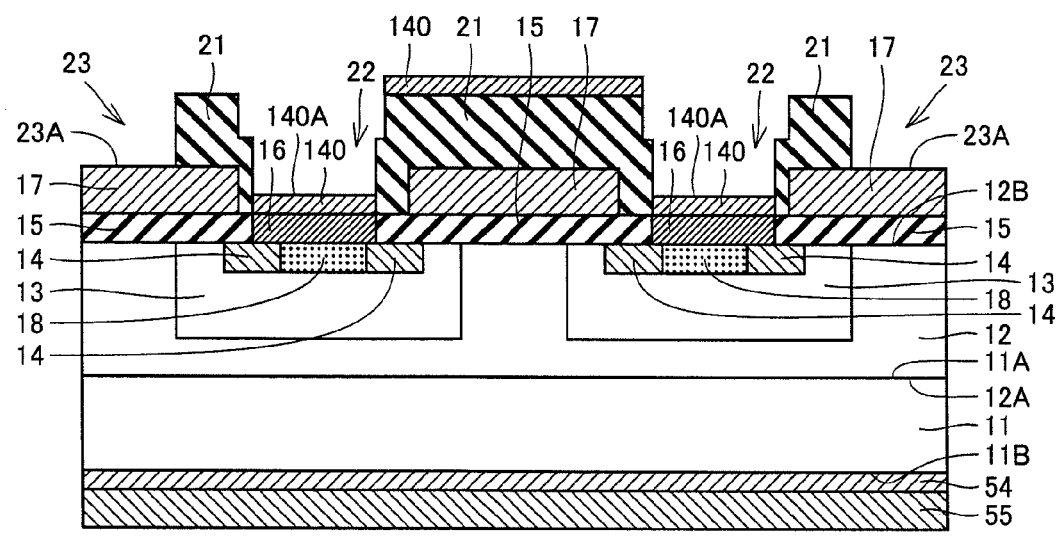
FIG. 21 is a schematic cross-sectional view for illustrating the method of manufacturing the MOSFET in the second embodiment.

Next, referring to FIG. 17, a gate electrode portion opening step (S100) is performed. This step (S100) is identical to the step (S100) in the first embodiment. As a result, referring to FIG. 21, a portion of interlayer insulating film 21 formed on the main surface of gate electrode 17 is removed.

Figure 22:
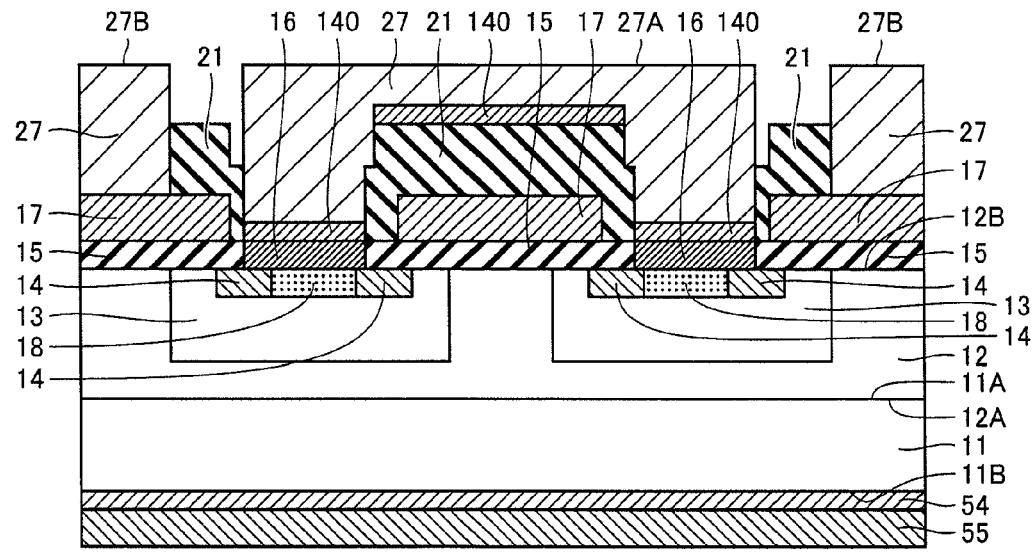
FIG. 22 is a schematic cross-sectional view for illustrating the method of manufacturing the MOSFET in the second embodiment.

Next, referring to FIG. 17, a front surface electrode pad formation step (S120) is performed. This step (S120) is identical to the step (S120) in the first embodiment. Namely, a metal layer serving as a front surface electrode pad is formed on electrode main surface 23A in gate contact hole 23 and on a protective film main surface 140A of protective film 140 arranged in contact with source contact electrode 16. It is to be noted that the step (S120) is preferably performed immediately after forming gate contact hole 23 in the step (S100). Thereby, the front surface electrode pad can be formed on electrode main surface 23A with no high-resistance layer formed therein. Accordingly, referring to FIG. 22, front surface electrode pad 27 is formed.

Next, referring to FIG. 17, a passivation film formation step (S130) is performed. This step (S130) is identical to the step (S130) in the first embodiment. As a result, referring to FIG. 23, passivation film 30 is formed.

Figure 23:
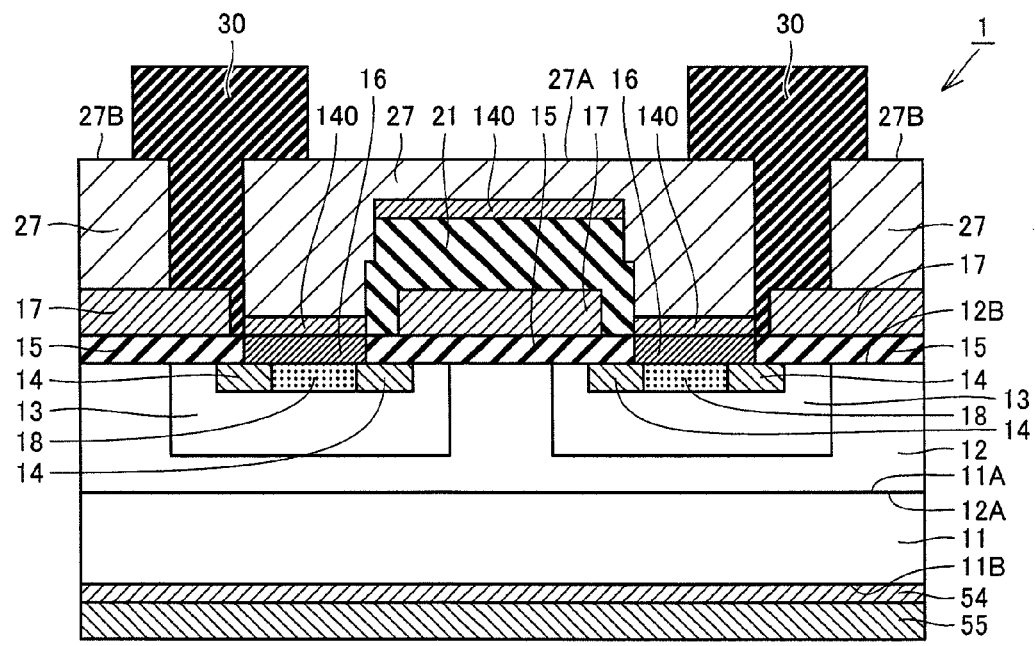
FIG. 23 is a schematic cross-sectional view showing a completed state of the MOSFET in the second embodiment.

It is to be noted, although the step (S120) and the step (S130) may be performed with protective film 140 on source contact electrode 16 remaining formed as shown in FIG. 23, protective film 140 may be removed immediately before performing the step (S120). In this case, the step (S120) is preferably performed immediately after removing protective film 140.

The present second embodiment is different from the present first embodiment only in each point described above. Namely, the second embodiment is fully in conformity with the first embodiment in the construction, the condition, the procedure, the effect, and the like that are not described above.

(Third Embodiment)

MOSFET 1 in a third embodiment includes main components shown in the schematic cross-sectional view in FIG. 1, as with MOSFET 1 in the first and second embodiments. However, the third embodiment is slightly different from the first and second embodiments with regard to the method of manufacturing MOSFET 1. Specifically, in order to suppress formation of a high-resistance layer due to oxidation of the main surface of the source contact electrode, the front surface electrode pad is formed immediately after the source contact electrode is formed. Namely, the front surface electrode pad in the third embodiment has a function corresponding to protective film 140 in the second embodiment (see FIGS. 18 to 23). Hereinafter, a method of manufacturing MOSFET 1 in the present second embodiment will be described.

Figure 24:
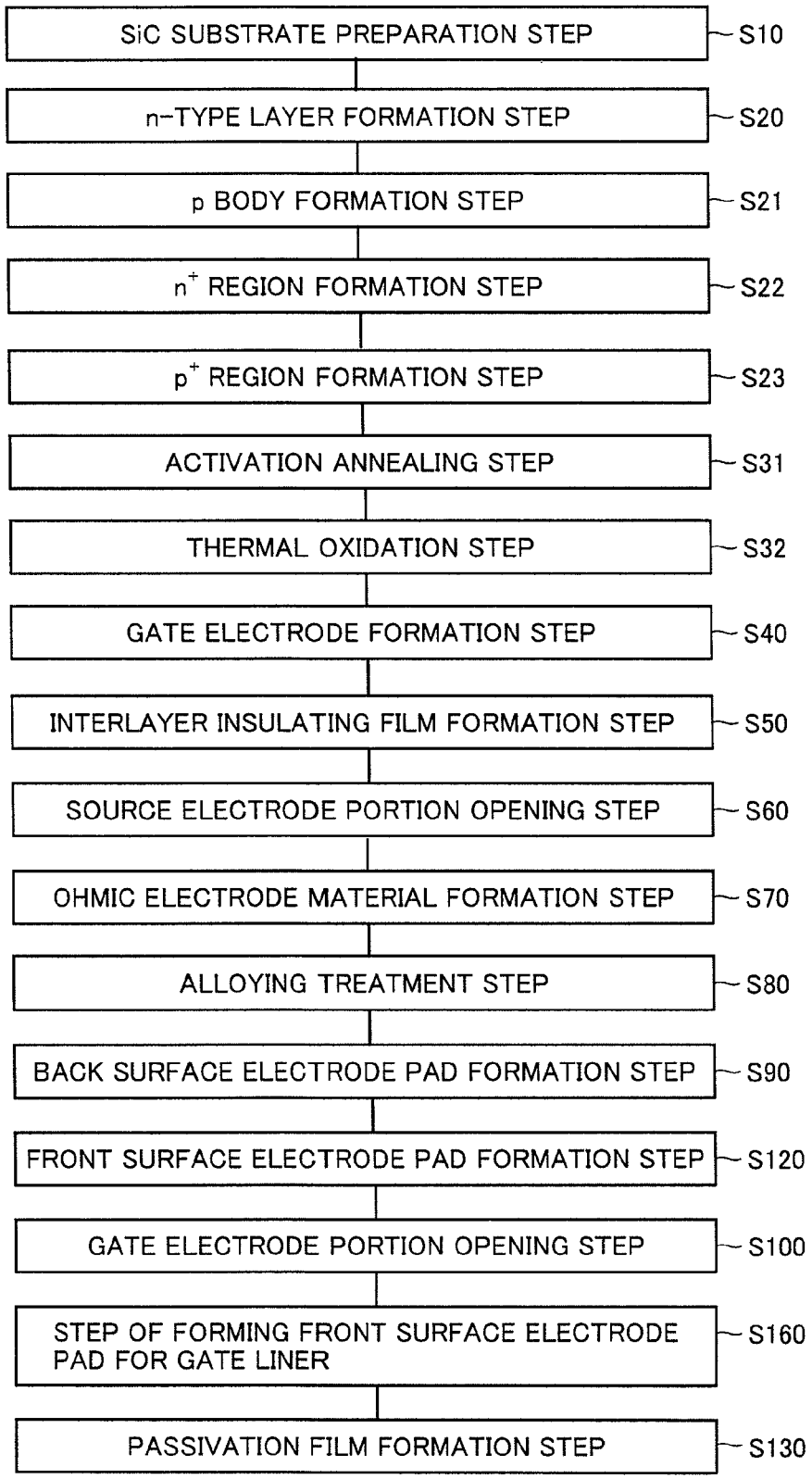
FIG. 24 is a flowchart showing an outline of a method of manufacturing a MOSFET in a third embodiment.

Referring to FIG. 24, the method of manufacturing the MOSFET in the third embodiment is in conformity with the methods of manufacturing the MOSFET in the first and second embodiments (see FIGS. 2 and 17), from the step (S 10) to the step (S80). Namely, also herein, when entire n+ SiC substrate 11 is temporarily exposed to the air when it goes through the step (S80) and proceeds to a subsequent step, if n+ SiC substrate 11 is cooled down to 100° C. or lower, formation of a high-resistance layer on the main surface of source contact electrode 16 can be suppressed.

In the manufacturing method in the third embodiment, referring to FIG. 24, a back surface electrode pad formation step (S90) is performed after the step (S80). The step (S90) in FIG. 24 is a step of performing treatment basically identical to that of the step (S90) in the first and second embodiments. Therefore, a state after the step (S90) in FIG. 24 is performed can be explained with reference to FIG. 12 described above. However, in the step (S90) in FIG. 24, when entire n+ SiC substrate 11 is temporarily exposed to the air when it goes through the step (S90) and proceeds to a subsequent step, it is preferable to cool down n+ SiC substrate 11 to 100° C. or lower. In this regard, the step (S90) in the third embodiment is different from the step (S90) in the first embodiment.

This can reduce a rate at which a high-resistance layer is formed due to oxidation of the uppermost surface of source contact electrode 16 (electrode main surface 16A: see FIG. 13) and electrode main surface 23A in gate contact hole 23 (see FIG. 13) caused by exposing n+ SiC substrate 11 heated to 100° C. or higher to an atmosphere containing oxygen, such as to the air, after performing the step (S90). As described above, in the process of performing the step (S90), heat treatment is performed to improve adhesion property of formed back surface electrode pad 55 with Ni film 54. Since oxygen is not contained in the atmosphere in which this heat treatment is performed, even if a sample is heated to 100° C. or higher, there is little possibility that the vicinity of electrode main surface 16A is oxidized and a high-resistance layer is formed. However, when entire n+ SiC substrate 11 is temporarily exposed to the air when it goes through the step (S90) and proceeds to a subsequent step, if n+ SiC substrate 11 is cooled down to 100° C. or lower, formation of a high-resistance layer can be suppressed.

In a state where formation of a high-resistance layer is suppressed by the above procedure, referring to FIG. 24, a front surface electrode pad formation step (S120) is performed. This step (S120) is identical to the step (S120) in the first embodiment. Namely, referring to FIG. 25, front surface electrode pad 27 as in the first and second embodiments is formed on electrode main surface 16A of source contact electrode 16 for which formation of a high-resistance layer has been suppressed in the step (S90). Thus, the inside of contact hole 22 is filled with front surface electrode pad 27.

Since front surface electrode pad 27 is formed in contact with source contact electrode 16, formation of front surface electrode pad 27 can suppress subsequent formation of a high-resistance layer in electrode main surface 16A of source contact electrode 16. Namely, the front surface electrode pad formation step (S120) in the third embodiment corresponds to, for example, the protective film vapor-deposition step (S140) in the second embodiment. Further, front surface electrode pad 27 on source contact electrode 16 in the third embodiment corresponds to, for example, protective film 140 in the second embodiment. Therefore, the front surface electrode pad may be formed to have a function as a protective film.

Figure 25:
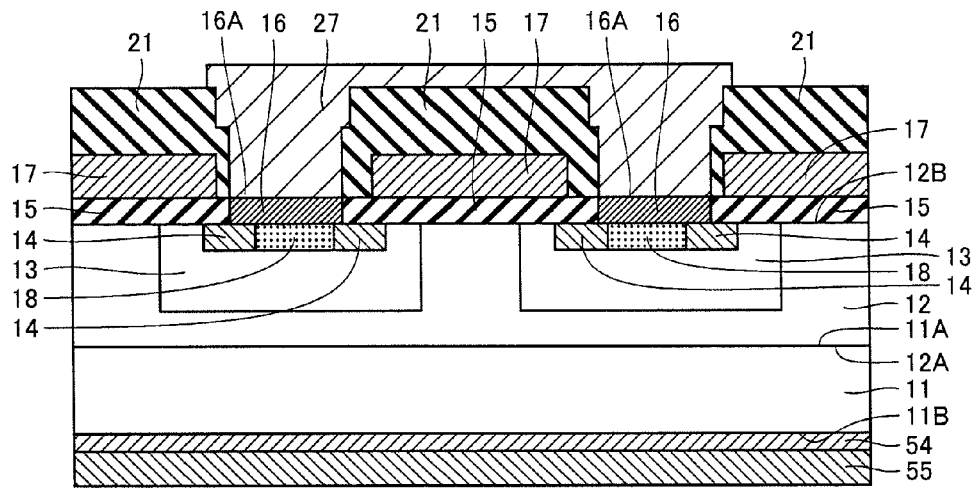
FIG. 25 is a schematic cross-sectional view for illustrating the method of manufacturing the MOSFET in the third embodiment.

It is to be noted that, also in the step (S120) in the third embodiment, front surface electrode pad 27 on gate electrodes 17 on the right and left sides shown in FIG. 25 is preferably removed, for the same reason as the reason why it is preferable to remove protective film 140 on gate electrodes 17 on the right and left sides shown in FIG. 20 in the step (S140) in the second embodiment.

Figure 26:
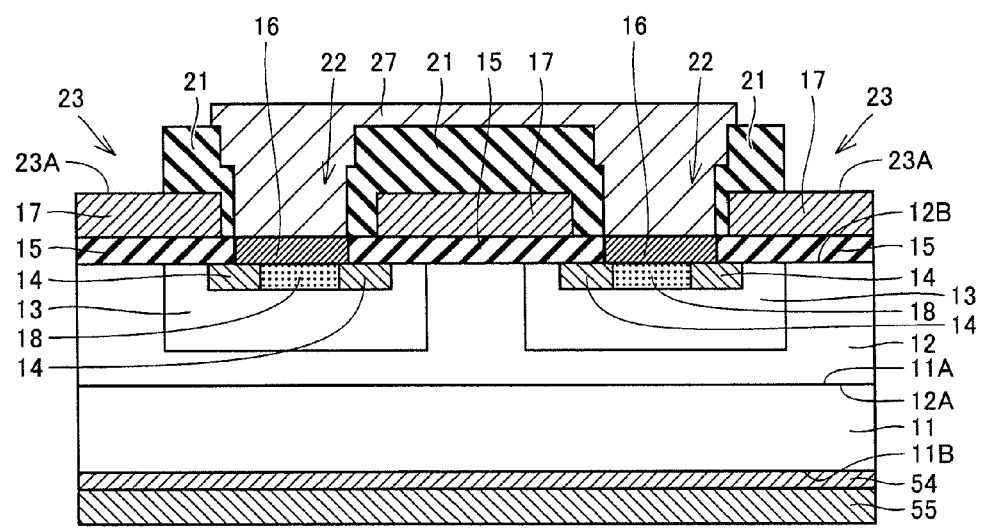
FIG. 26 is a schematic cross-sectional view for illustrating the method of manufacturing the MOSFET in the third embodiment.

Next, referring to FIG. 24, a gate electrode portion opening step (S100) is performed. This step (S100) is identical to the step (S100) in the first embodiment. As a result, referring to FIG. 26, a portion of interlayer insulating film 21 formed on the main surface of gate electrode 17 is removed.

Next, referring to FIG. 24, the step of forming a front surface electrode pad for a gate liner (S160) is performed. This is a step of forming a front surface electrode pad identical to the front surface electrode pad formed in the step (S120) in FIG. 24 described above, on electrode main surfaces 23A in gate contact holes 23 formed on the main surfaces of gate electrodes 17 on the right and left sides of FIG. 26 in the step (S100).

Figure 27:
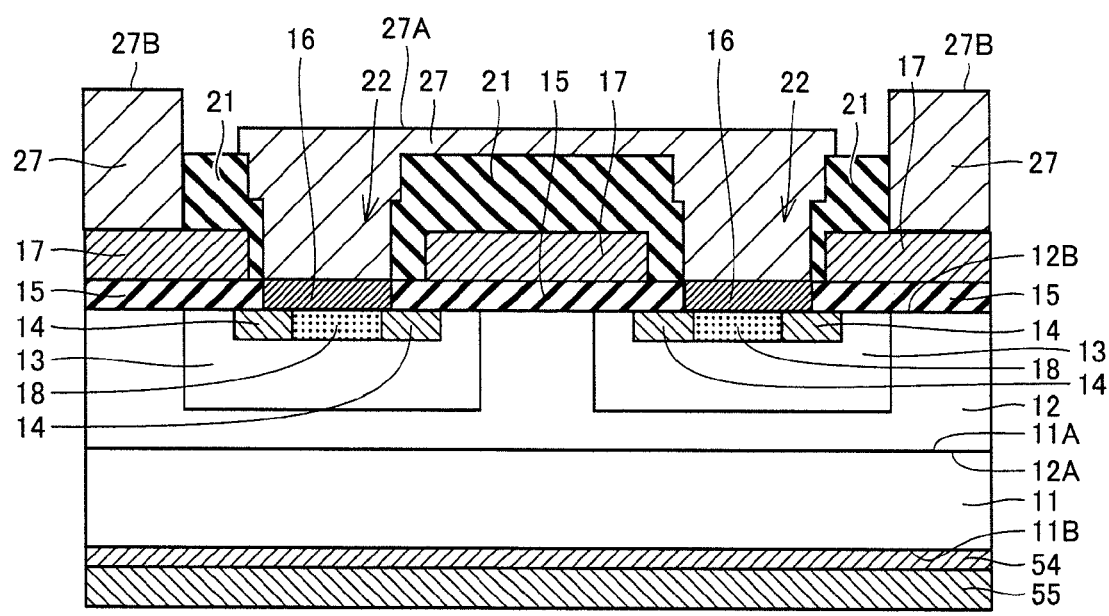
FIG. 27 is a schematic cross-sectional view for illustrating the method of manufacturing the MOSFET in the third embodiment.

Specifically, referring to FIG. 27, a thin film layer composed of Ti and Al is formed in this order, for example by sputtering, all over gate contact holes 23, front surface electrode pad 27 formed in the step (S120) electrically connecting a pair of source contact electrodes 16, and interlayer insulating film 21. Subsequently, after a resist is applied onto an uppermost surface of the formed Al film, exposure and development are performed, and thereby front surface electrode pad 27 in a desired region is removed together with the resist. Thus, front surface electrode pad 27 is formed on the main surfaces of gate electrodes 17 (on electrode main surfaces 23A in gate contact holes 23) on the right and left sides of FIG. 26.

It is to be noted that, in the step (S160), front surface electrode pad 27 is also formed to overlie pad uppermost surface 27A of front surface electrode pad 27 already formed in the step (S120) to connect a pair of source contact electrodes 16. Namely, front surface electrode pad 27 at that portion has a thickness greater than that of front surface electrode pad 27 newly formed in the step (S160). However, front surface electrode pad 27 serving as a source electrode in MOSFET 1 and front surface electrode pad 27 serving as a gate liner may have different thicknesses in this manner.

Next, referring to FIG. 24, a passivation film formation step (S130) is performed. This step (S130) is identical to the step (S130) in the first embodiment. As a result, passivation film 30 as in FIG. 16 in the first embodiment described above is formed, and MOSFET 1 as in FIG. 16 is formed.

The present third embodiment is different from the present first and second embodiments only in each point described above. Namely, the third embodiment is fully in conformity with the first and second embodiments in the construction, the condition, the procedure, the effect, and the like that are not described above.

(Fourth Embodiment)

Figure 28:
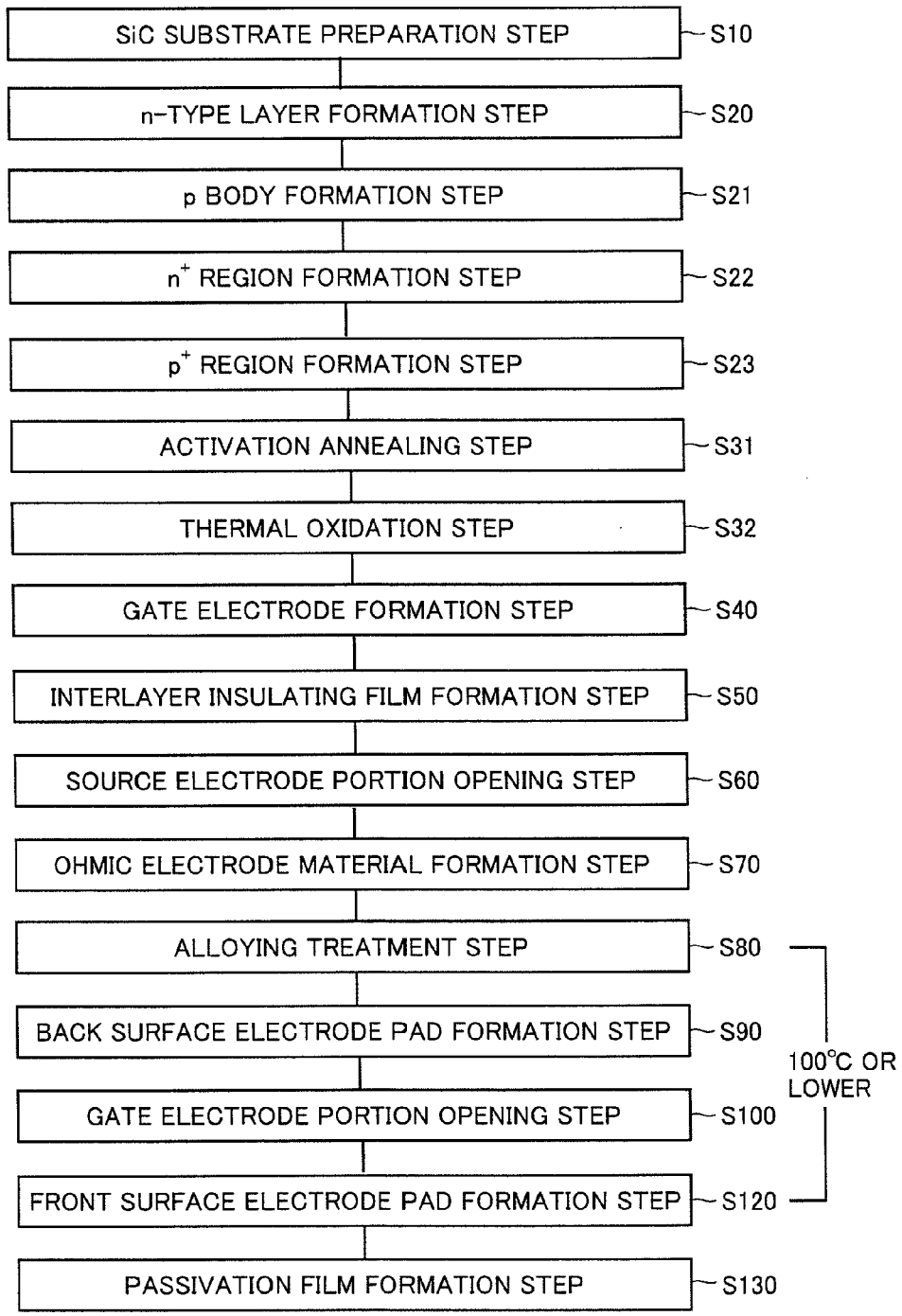
FIG. 28 is a flowchart showing an outline of a method of manufacturing a MOSFET in a fourth embodiment.

MOSFET 1 in a fourth embodiment includes main components shown in the schematic cross-sectional view in FIG. 1, as with MOSFET 1 in the first embodiment. In addition, a completed state thereof is as shown in the schematic cross-sectional view in FIG. 16. However, in the fourth embodiment, attention is paid not to perform treatment of heating n+ SiC substrate 11 to 100° C. or higher in an atmosphere containing oxygen from when alloyed source contact electrode 16 is formed in the step (S80) to when front surface electrode pad 27 is formed on the main surface of source contact electrode 16 in the step (S120), in order to suppress oxidation of electrode main surface 16A of source contact electrode 16 and electrode main surface 23A in gate contact hole 23 described in the first embodiment. This can suppress formation of a high-resistance layer on the main surface of source contact electrode 16 and the like. Thus, referring to FIG. 28, the high-resistance layer removal step (S110) included in the flowchart of the first embodiment in FIG. 2 can be omitted. Thereby, the number of steps can be decreased and manufacturing cost can be reduced, when compared with the first embodiment. It is to be noted that, from the step (S80) to the step (S120), it is more preferable not to perform treatment of heating n+ SiC substrate 11 to 100° C. or higher in an atmosphere containing oxygen. Further, from the step (S80) to the step (S120) described above, it is more preferable not to perform treatment of heating n+ SiC substrate 11 to 60° C. or higher in an atmosphere containing oxygen.

In the fourth embodiment, a back surface electrode pad forming step (S90) is included between the step (S80) and the step (S120). In the step (S90), n+ SiC substrate 11 is heated to approximately 400° C. Therefore, as described above, in the step (S90), an atmosphere surrounding n+ SiC substrate 11 being heated is preferably an atmosphere of an inert gas such as Ar. Further, in a case where n+ SiC substrate 11 is temporarily taken out of a furnace in which the step (S90) has been performed and exposed to the air in order to proceed to the step (S 100) as a subsequent step, it is preferable to confirm that n+ SiC substrate 11 has been cooled down to 100° C. or lower, and then discharge n+ SiC substrate 11 into the air.

The present fourth embodiment is different from the present first embodiment only in each point described above. Namely, the fourth embodiment is fully in conformity with the first embodiment in the construction, the condition, the procedure, the effect, and the like that are not described above.

All of the above first to fourth embodiments have described a MOSFET as an example. However, the embodiments of the present invention are applicable to any type of semiconductor device provided with a structure having an electrode that establishes ohmic contact with both of an n-type region and a p-type region. For example, even if the embodiments of the present invention are employed in a JFET, an IGBT, and a pn diode, the sameness of invention as the inventions according to the first to fourth embodiments described above is not impaired.

Although the embodiments of the present invention have been described above, it should be understood that the embodiments disclosed herein are illustrative and non-restrictive in every respect. The scope of the present invention is defined by the terms of the claims, and is intended to include any modifications within the scope and meaning equivalent to the terms of the claims.

INDUSTRIAL APPLICABILITY

The present invention is particularly excellent as a technique of manufacturing a semiconductor device that can be in contact with both of an n-type SiC region and a p-type SiC region and can suppress increase in contact resistance due to oxidation.

REFERENCE SIGNS LIST

1: MOSFET, 11: n+ SiC substrate, 11A: one main surface, 11B: the other main surface, 12: n− SiC layer, 12A: the first main surface, 12B: the second main surface, 13: p body, 14: n+ source region, 15: gate oxide film, 15A: thermal oxidation film, 16: source contact electrode, 16A, 16B, 23A, 23B: electrode main surface, 16C: high-resistance layer, 17: gate electrode, 18: p+ region, 21: interlayer insulating film, 22: contact hole, 23: gate contact hole, 27: front surface electrode pad, 27A, 27B: pad uppermost surface, 30: passivation film, 51: Ti film, 52: Al film, 53: Si film, 54: Ni film, 55: back surface electrode pad, 140: protective film, 140A: protective film main surface.

The invention claimed is:

1. A method of manufacturing a semiconductor device, comprising the steps of:
preparing a SiC layer composed of silicon carbide;
forming an n-type region and a p-type region in said SiC layer; and
forming an ohmic electrode on a main surface of said SiC layer,
wherein the step of forming said ohmic electrode includes the steps of forming a conductor layer having an aluminum film and a titanium film which will become said ohmic electrode on the main surface of said SiC layer, and performing heat treatment such that said conductor layer becomes said ohmic electrode,
in the step of forming said ohmic electrode, said conductor layer having the titanium film, the aluminum film, and a silicon film is formed such that the titanium film is to be in contact with both of said n-type region and said p-type region,
in the step of forming said ohmic electrode, an ohmic contact electrode containing titanium, aluminum, and silicon is formed, and
after the step of performing said heat treatment, a temperature of said ohmic electrode when a surface of said ohmic electrode is exposed to an atmosphere containing oxygen is set to 100° C. or lower.

2. The method of manufacturing a semiconductor device according to claim 1, further comprising the step of forming an electrode pad on one main surface of said ohmic electrode after the step of forming said ohmic electrode.

3. The method of manufacturing a semiconductor device according to claim 2, comprising the step of removing an oxidized region formed in the one main surface of said ohmic electrode after the step of forming said ohmic electrode and before the step of forming said electrode pad.

4. The method of manufacturing a semiconductor device according to claim 2, comprising the step of maintaining the one main surface of said ohmic electrode at 100° C. or lower in the atmosphere containing oxygen after the step of forming said ohmic electrode and before the step of forming said electrode pad.

5. The method of manufacturing a semiconductor device according to claim 2, comprising the step of forming a protective film on the one main surface of said ohmic electrode after the step of forming said ohmic electrode and before the step of forming said electrode pad.

6. The method of manufacturing a semiconductor device according to claim 1, wherein said SiC layer contains an n-type impurity.

7. The method of manufacturing a semiconductor device according to claim 1, wherein the titanium film has a thickness of not smaller than 100 Å and not greater than 400 Å.

8. The method of manufacturing a semiconductor device according to claim 1, wherein the silicon film has a thickness of not smaller than 100 Å and not greater than 500 Å.

9. The method of manufacturing a semiconductor device according to claim 1, wherein the aluminum film is at least 1.5 times and at most 6 times as thick as the titanium film.

10. The method of manufacturing a semiconductor device according to claim 1, wherein, in the step of forming said ohmic electrode, the titanium film, the aluminum film, and the silicon film are formed in this order.

* * * * *